United States Patent
Suganumata

(10) Patent No.: US 9,056,761 B2
(45) Date of Patent: Jun. 16, 2015

(54) SEMICONDUCTOR SENSOR DEVICE AND ELECTRONIC APPARATUS INCLUDING THE SEMICONDUCTOR DEVICE

(71) Applicant: Masayuki Suganumata, Tokyo (JP)

(72) Inventor: Masayuki Suganumata, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 13/790,516

(22) Filed: Mar. 8, 2013

(65) Prior Publication Data

US 2013/0234264 A1 Sep. 12, 2013

(30) Foreign Application Priority Data

Mar. 9, 2012 (JP) .................................. 2012-053809
Sep. 28, 2012 (JP) .................................. 2012-218031
Mar. 5, 2013 (JP) .................................. 2013-042610

(51) Int. Cl.
| | | |
|---|---|---|
| *H01L 23/02* | (2006.01) | |
| *H01L 23/04* | (2006.01) | |
| *H01L 23/12* | (2006.01) | |
| *H01L 29/40* | (2006.01) | |
| *H01L 23/28* | (2006.01) | |
| *H01L 23/52* | (2006.01) | |
| *H01L 23/48* | (2006.01) | |
| *B81B 7/00* | (2006.01) | |
| *G01L 9/00* | (2006.01) | |
| *H01L 23/00* | (2006.01) | |
| *H01L 23/31* | (2006.01) | |
| *G01L 11/02* | (2006.01) | |

(52) U.S. Cl.
CPC . B81B 7/007 (2013.01); G01L 9/00 (2013.01); H01L 23/00 (2013.01); H01L 23/3121 (2013.01); *H01L 2224/32145* (2013.01); G01L 11/025 (2013.01)

(58) Field of Classification Search
CPC ........... H01L 2924/01078; H01L 2224/48091; H01L 2924/15311; H01L 2924/01013
USPC .................. 257/678, 730, 731, 786, 787, 773
See application file for complete search history.

(56) References Cited

U.S. PATENT DOCUMENTS

| | | | |
|---|---|---|---|
| 5,251,190 A * | 10/1993 | Miyasaka et al. ................ 368/10 |
| 2009/0191755 A1* | 7/2009 | Ma et al. .................... 439/607.1 |
| 2009/0291581 A1* | 11/2009 | Zhu et al. ....................... 439/325 |
| 2012/0119238 A1* | 5/2012 | Huang et al. .................... 257/89 |
| 2012/0215475 A1* | 8/2012 | Rutledge et al. ................ 702/94 |

FOREIGN PATENT DOCUMENTS

JP 2001-033326 2/2001

* cited by examiner

*Primary Examiner* — Dilinh Nguyen
(74) *Attorney, Agent, or Firm* — IPUSA, PLLC

(57) ABSTRACT

Disclosed is a semiconductor sensor device, including a substrate, a sensor element mounted on the substrate, a hollow member configured to surround a periphery of the sensor element, a sealing material configured to fill in the hollow member and cover the sensor element, and a recess formed on the substrate, the recess being configured to position the hollow member.

16 Claims, 20 Drawing Sheets

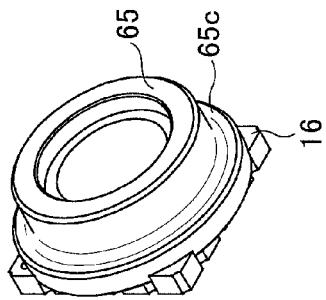
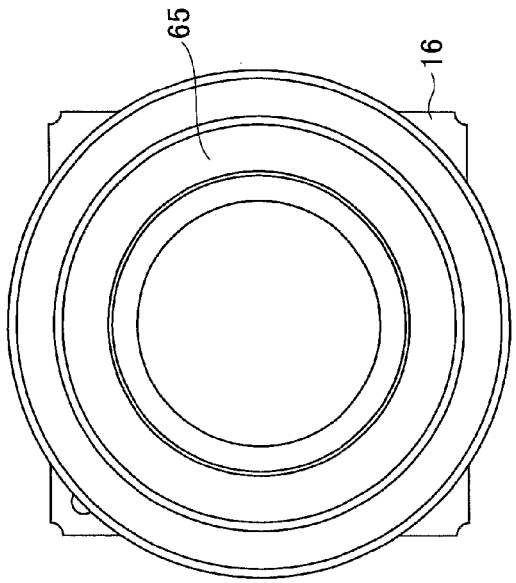
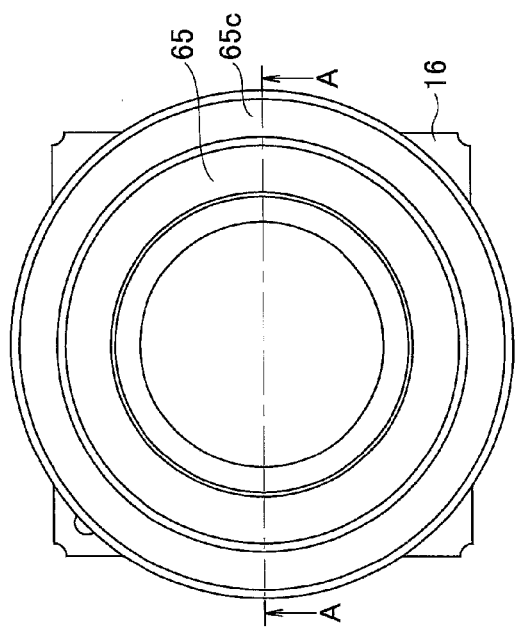
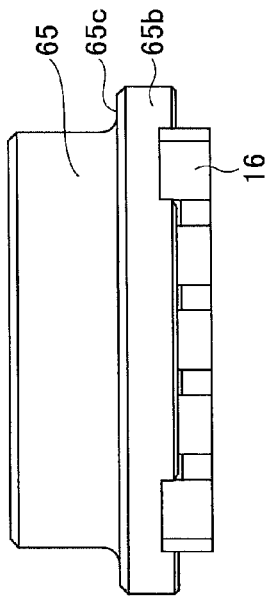
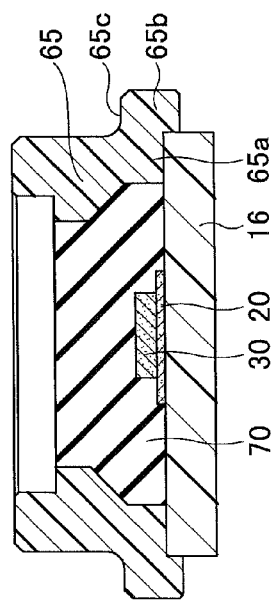

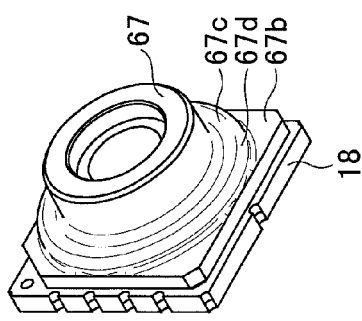
FIG.17E
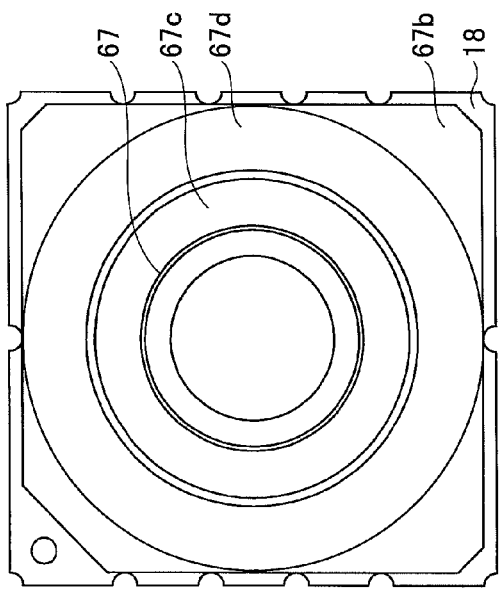
FIG.17C
FIG.17D
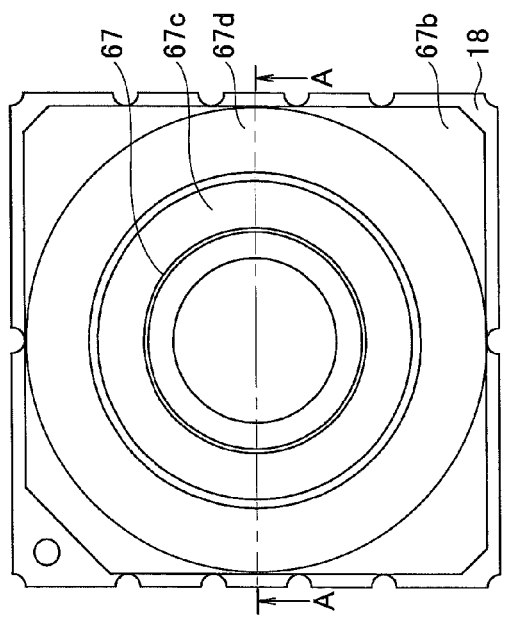
FIG.17A
FIG.17B

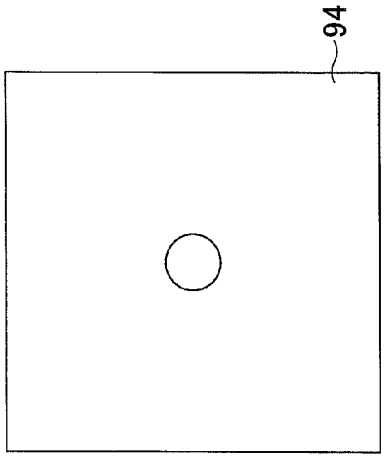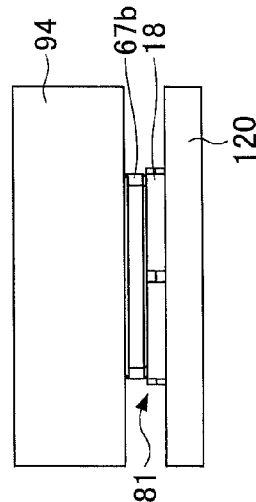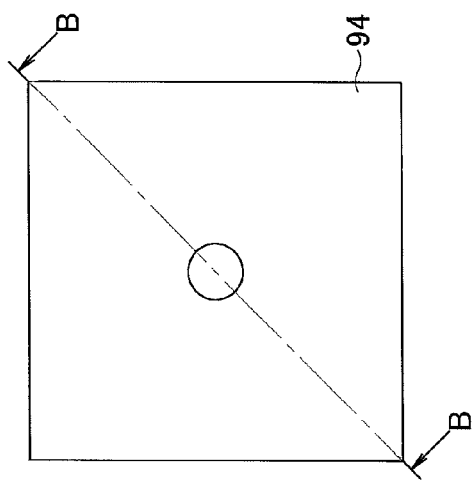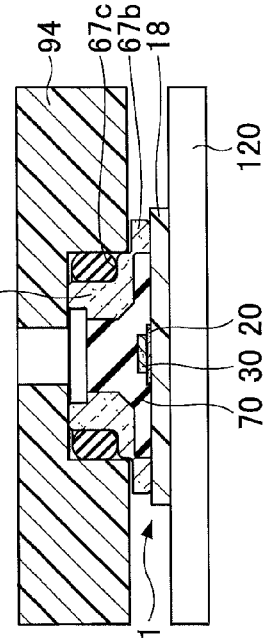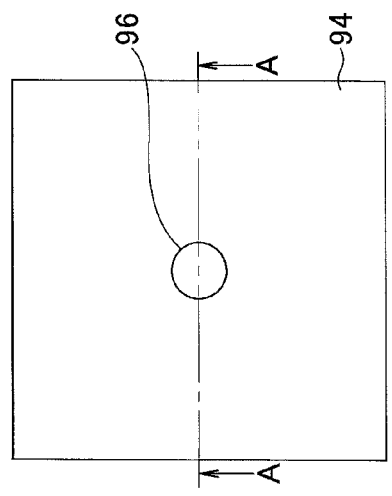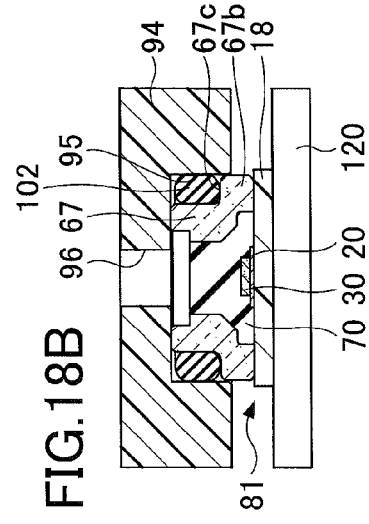

CROSS SECTION A-A

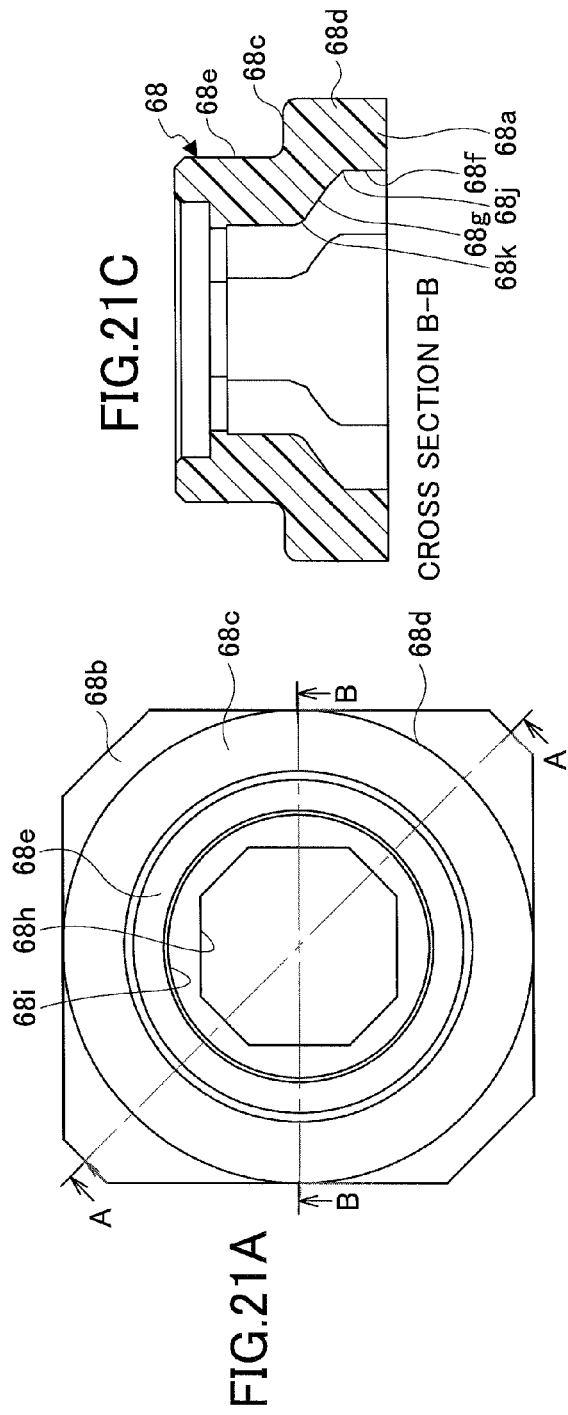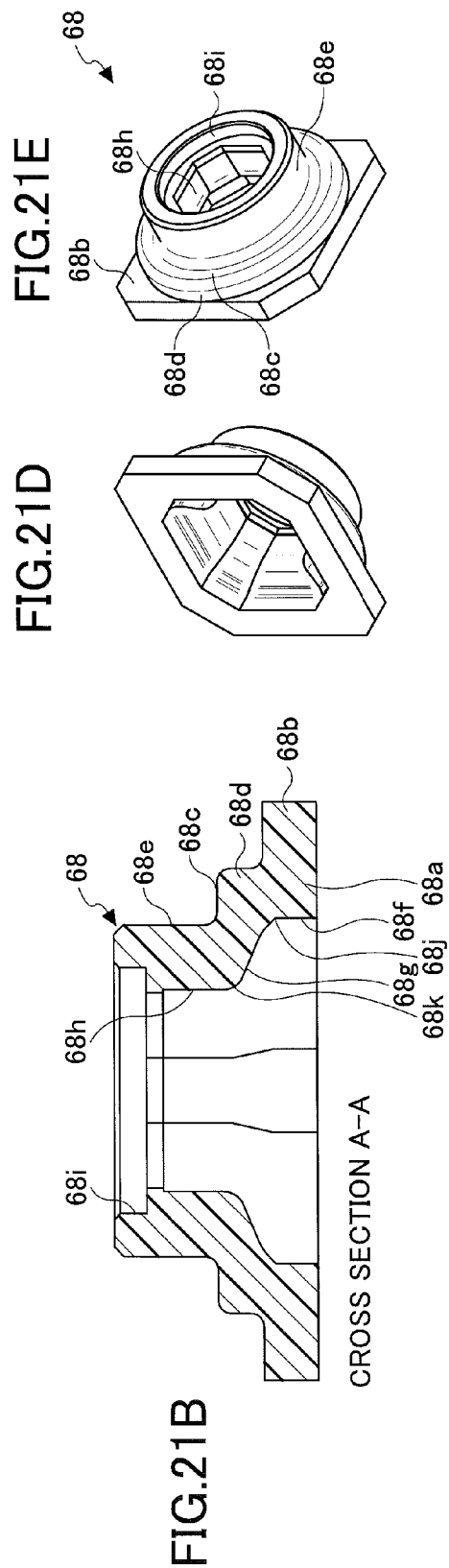

SEMICONDUCTOR SENSOR DEVICE AND ELECTRONIC APPARATUS INCLUDING THE SEMICONDUCTOR DEVICE

BACKGROUND OF THE INVENTION

1. Field of the Invention

An aspect of the present invention relates to at least one of a semiconductor sensor device and an electronic apparatus.

2. Description of the Related Art

Conventionally, a semiconductor sensor device has been known wherein a semiconductor-type pressure sensor and a control integrated circuit (IC) for controlling the same are mounted on a flat plate type substrate, wherein these are enclosed by a cylindrical cylinder and the cylinder is filled and sealed with a sealing material, so that the pressure sensor and the control IC are protected. For mounting a cylinder in manufacturing such a semiconductor sensor, a method using a positioning jig has been known conventionally.

FIG. 1A, FIG. 1B, and FIG. 1C are diagrams illustrating a conventional semiconductor sensor device assembled by using a positioning jig. FIG. 1A is a diagram illustrating a flat plate type substrate before a cylinder of the conventional semiconductor sensor device is mounted thereon, FIG. 1B is a cross-sectional view of the conventional semiconductor sensor device, and FIG. 1C is an enlarged view of an area A of the conventional semiconductor sensor device as indicated by a broken line in FIG. 1B.

As illustrated in FIG. 1A, the conventional semiconductor sensor device is configured in such a manner that a control IC 220 and a sensor element 230 are mounted on a flat plate type substrate 210, around which a pad 240 is formed, and a wiring 250 extends from the pad 240 to an outside thereof.

As illustrated in FIG. 1B, the conventional semiconductor sensor device is configured in such a manner that a cylindrical cylinder 260 is mounted to surround a periphery of the control IC 220 and the sensor element 230 mounted on the substrate 210 and a sealing material 270 fills in the cylinder 260 so that the sensor element 230 and the control IC 220 are protected.

Furthermore, as illustrated in FIG. 10, the wiring 250 extends and is formed under the cylinder 260 and the sealing material 270. A contact hole is formed on the substrate 210 to connect with such a wiring 250, so that electrical connection with an exterior is conducted.

However, a ring-shaped bottom face of the cylinder 260 is merely bonded to the substrate 210 by an adhesive agent and a surface area adhering to the substrate 210 is reduced, so that a problem may be that an adhesion strength is reduced and the cylinder 260 may separate from the substrate 210.

FIG. 2 is a diagram illustrating a method for mounting a cylinder of the conventional semiconductor device illustrated in FIG. 1A, FIG. 1B, and FIG. 10. As illustrated in FIG. 2, while a periphery of the substrate 210 is enclosed by a positioning jig 290, the substrate 210 is positioned in the positioning jig 290 and the cylinder 260 is positioned at an entrance of the positioning jig 290 and thus mounted on the substrate 210.

However, in this case, a problem may be that an error originating from a substrate dimension tolerance and an error originating from a jig dimension tolerance between the substrate 210 and the positioning jig 260, and an error originating from a cylinder dimension tolerance and an error originating from a jig dimension tolerance between the cylinder 260 and the positioning jig 290, are caused so that it is not possible to improve precision of mounting of the cylinder 260. Furthermore, it is possible to arrange components on the substrate 210 using image recognition at improved precision, but an outline of the substrate 210 forms a V-shaped groove at a border between individual substrates 210 in an aggregate of substrates and mechanical cutting is to apply a pressure thereto so as to cause cutting along the V-shaped groove, so that it is not possible to be dimensioned at improved precision. Accordingly, a problem may be that an error originating from a dimension tolerance between the substrate 210 and the positioning jig 290 increases, and structurally, it is difficult to position and mount the cylinder 260 at improved precision.

In order to solve such problems in adhesion strength between a cylinder and a substrate and precision of mounting of a cylinder, a semiconductor sensor device has been suggested wherein a sensor element and a control IC are mounted on a substrate having a circular and convex shape and a cylinder is positioned to mate with the circular and convex shape, so that the cylinder is mounted (see, for example, Japanese Patent Application Publication No. 2001-033326).

FIG. 3A, FIG. 3B, and FIG. 3C are diagrams illustrating a conventional semiconductor sensor device using a convex-shaped substrate as described in Japanese Patent Application Publication No. 2001-033326. FIG. 3A is a diagram illustrating the convex-shaped substrate, FIG. 3B is a cross-sectional view of the conventional semiconductor sensor device using the convex-shaped substrate, and FIG. 3C is an enlarged view of an area B of the conventional semiconductor sensor device using the convex-shaped substrate as indicated by a broken line in FIG. 3B.

As illustrated in FIG. 3A, a circular and convex shape 311 is formed in a central area of a substrate 310, and a pad 340 and a wiring 350 are formed in the convex shape 311.

As illustrated in FIG. 3B, a cylinder 360 is positioned to mate with the convex shape 311 and mounted on the substrate 310. Then, a sealing material 370 fills in the cylinder 360 to protect a sensor element 330 and a control IC 320. Thereby, it is possible to facilitate positioning of the cylinder 360, increase a surface area for placing the substrate 310 and the cylinder 360, and improve an adhesion strength thereof.

However, in the conventional semiconductor sensor device using the convex-shaped substrate as described in Japanese Patent Application Publication No. 2001-033326, a step is produced on the substrate 310 due to the convex shape 311 as illustrated in FIG. 3C, so that the wiring 350 has to be contained in the convex shape 311 and it is not possible to be provided to extend under the cylinder 360. Thereby, a problem may be that it is not possible for the wiring 350 to extend sufficiently and a restriction is caused in such a manner that a contact hole to be formed on the substrate 310 has to be formed on a restricted area under the convex shape 311. Furthermore, the cylinder 360 with an increased diameter has to be used accordingly in order to ensure a sufficient length of the wiring 350, and as a result, a problem may be that miniaturization of a semiconductor sensor device is difficult.

SUMMARY OF THE INVENTION

According to one aspect of the present invention, there is provided a semiconductor sensor device, including a substrate, a sensor element mounted on the substrate, a hollow member configured to surround a periphery of the sensor element, a sealing material configured to fill in the hollow member and cover the sensor element, and a recess formed on the substrate, the recess being configured to position the hollow member.

According to another aspect of the present invention, there is provided an electronic apparatus, including the semiconductor sensor device as described above and a housing, the housing including a concave semiconductor sensor device containment part configured to contain the semiconductor sensor device.

According to another aspect of the present invention, there is provided an electronic apparatus, including the semiconductor sensor device as described above, a housing, the housing including a concave semiconductor sensor device containment part configured to contain the semiconductor sensor device, and an elastic member provided in a space formed by a bottom face of the semiconductor sensor device containment part and the stepwise face included in the hollow member.

According to another aspect of the present invention, there is provided a semiconductor sensor device, including a substrate, a sensor element mounted on the substrate, a hollow member mounted on the substrate, the hollow member being configured to cover a periphery of the sensor element, the hollow member including a stepwise face formed at an outside of the hollow member, the stepwise face having a height less than a height of the hollow member at an inside of the hollow member, and a sealing material configured to fill in the hollow member and cover the sensor element.

According to another aspect of the present invention, there is provided an electronic apparatus, including the semiconductor sensor device as described above, a housing, the housing including a concave semiconductor sensor device containment part configured to contain the semiconductor sensor device, and an elastic member provided in a space formed by a bottom face of the semiconductor sensor device containment part and the stepwise face included in the hollow member.

BRIEF DESCRIPTION OF THE DRAWINGS

FIG. 1A is a diagram illustrating a flat plate type substrate before a cylinder of the conventional semiconductor sensor device is mounted thereon. FIG. 1B is a cross-sectional view of the conventional semiconductor sensor device. FIG. 1C is an enlarged view of an area A of the conventional semiconductor sensor device as indicated by a broken line in FIG. 1B.

FIG. 3A is a diagram illustrating the convex-shaped substrate. FIG. 3B is a cross-sectional view of the conventional semiconductor sensor device using the convex-shaped substrate. FIG. 3C is an enlarged view of an area B of the conventional semiconductor sensor device using the convex-shaped substrate as indicated by a broken line in FIG. 3B.

FIG. 4A is a perspective view illustrating a substrate and a mounted component of the one example of a semiconductor sensor device according to Practical Example 1. FIG. 4B is a cross-sectional view of the one example of a semiconductor sensor device according to Practical Example 1. FIG. 4C is an enlarged view of a broken line area C in FIG. 4B.

FIG. 7A is a diagram illustrating a process for preparing a substrate in the one example of a method for manufacturing a semiconductor sensor device according to Practical Example 1. FIG. 7B is a diagram illustrating a process for mounting a control IC in the one example of a method for manufacturing a semiconductor sensor device according to Practical Example 1. FIG. 7C is a diagram illustrating a process for mounting a sensor element in the one example of a method for manufacturing a semiconductor sensor device according to Practical Example 1. FIG. 7D is a diagram illustrating a process for mounting a cylinder in the one example of a method for manufacturing a semiconductor sensor device according to Practical Example 1. FIG. 7E is a diagram illustrating a sealing process in the one example of a method for manufacturing a semiconductor sensor device according to Practical Example 1.

FIG. 8A is a plan view of the semiconductor sensor device according to Practical Example 2. FIG. 8B is a perspective cross-sectional view of the semiconductor sensor device according to Practical Example 2.

FIG. 9A is a plan view of the semiconductor sensor device according to Practical Example 3. FIG. 9B is a perspective cross-sectional view of the semiconductor sensor device according to Practical Example 3.

FIG. 10A is a plan view of the semiconductor sensor device according to Practical Example 4. FIG. 10B is a perspective cross-sectional view of the semiconductor sensor device according to Practical Example 4.

FIG. 11A is a plan view of the semiconductor sensor device according to Practical Example 5. FIG. 11B is a perspective cross-sectional view of the semiconductor sensor device according to Practical Example 5.

FIG. 14A is a plan view of the semiconductor sensor device according to Practical Example 8. FIG. 14B is a cross-sectional diagram of a plane provided by cutting in a cross section A-A in FIG. 14A. FIG. 14C is a plan view of the semiconductor sensor device according to Practical Example 8. FIG. 14D is a front view corresponding to FIG. 14C. FIG. 14E is a perspective view of the semiconductor sensor device according to Practical Example 8.

FIG. 15A, FIG. 15B, FIG. 15C, FIG. 15D, and FIG. 15E are diagrams illustrating one example of a semiconductor sensor device according to Practical Example 9 of the present invention. FIG. 15A is a plan view of the semiconductor sensor device according to Practical Example 9. FIG. 15B is a cross-sectional diagram of a plane provided by cutting in a cross section A-A in FIG. 15A. FIG. 15C is a plan view of the semiconductor sensor device according to Practical Example 9. FIG. 15D is a front view corresponding to FIG. 15C. FIG. 15E is a perspective view of the semiconductor sensor device according to Practical Example 9.

FIG. 16A is a plan view of the semiconductor sensor device according to Practical Example 10. FIG. 16B is a cross-sectional diagram of a plane provided by cutting in a cross section A-A in FIG. 16A. FIG. 16C is a plan view of the semiconductor sensor device according to Practical Example 10. FIG. 16D is a front view corresponding to FIG. 16C. FIG. 16E is a perspective view of the semiconductor sensor device according to Practical Example 10.

FIG. 17A, FIG. 17B, FIG. 17C, FIG. 17D, and FIG. 17E are diagrams illustrating one example of a semiconductor sensor device according to Practical Example 11 of the present invention. FIG. 17A is a plan view of the semiconductor sensor device according to Practical Example 11. FIG. 17B is a cross-sectional diagram of a plane provided by cutting in a cross section A-A in FIG. 17A. FIG. 17C is a plan view of the semiconductor sensor device according to Practical Example 11. FIG. 17D is a front view corresponding to FIG. 17C. FIG. 17E is a perspective view of the semiconductor sensor device according to Practical Example 11.

FIG. 18A, FIG. 18B, FIG. 18C, FIG. 18D, FIG. 18E, and FIG. 18F are diagrams illustrating one example of an electronic apparatus according to Practical Example 12 of the present invention. FIG. 18A is a plan view of the electronic apparatus according to Practical Example 12. FIG. 18B is a cross-sectional diagram of a plane provided by cutting in a cross section A-A in FIG. 18A. FIG. 18C is a plan view of the electronic apparatus according to Practical Example 12. FIG. 18D is a cross-sectional diagram of a plane provided by cutting in a cross section B-B in FIG. 18C. FIG. 18E is a plan view of the electronic apparatus according to Practical Example 12. FIG. 18F is a front view corresponding to FIG. 18E.

FIG. 19A is a top view of the one example of a semiconductor sensor device according to Practical Example 13. FIG. 19B is an A-A cross-sectional diagram of the one example of a semiconductor sensor device according to Practical Example 13 as illustrated in FIG. 19A. FIG. 19C is a B-B cross-sectional diagram of the one example of a semiconductor sensor device according to Practical Example 13 as illustrated in FIG. 19A.

FIG. 20A is a bottom view of the cylinder of one example of a semiconductor sensor device according to Practical Example 13. FIG. 20B is a side view of the cylinder of one example of a semiconductor sensor device according to Practical Example 13. FIG. 20C is a top view of the cylinder of one example of a semiconductor sensor device according to Practical Example 13. FIG. 20D is a perspective view of the cylinder of one example of a semiconductor sensor device according to Practical Example 13. FIG. 20E is an A-A cross-sectional diagram of FIG. 20C. FIG. 20F is a B-B cross-sectional diagram of FIG. 20C.

FIG. 21A, FIG. 21B, FIG. 21C, FIG. 21D, and FIG. 21E are diagrams illustrating a configuration of one example of a cylinder in a semiconductor sensor device according to Practical Example 13 of the present invention. FIG. 21A is a plan view illustrating the one example of a cylinder of a semiconductor sensor device according to Practical Example 13 of the present invention. FIG. 21B is an A-A cross-sectional diagram of FIG. 21A. FIG. 21C is a B-B cross-sectional diagram of FIG. 21A. FIG. 21D is a top perspective view of the one example of a cylinder of a semiconductor sensor device according to Practical Example 13 of the present invention. FIG. 21E is bottom perspective view of the one example of a cylinder of a semiconductor sensor device according to Practical Example 13 of the present invention.

DETAILED DESCRIPTION OF THE PREFERRED EMBODIMENTS

An embodiment of the present invention will be described below, with reference to the drawings.

Practical Example 1

Figure 4A:
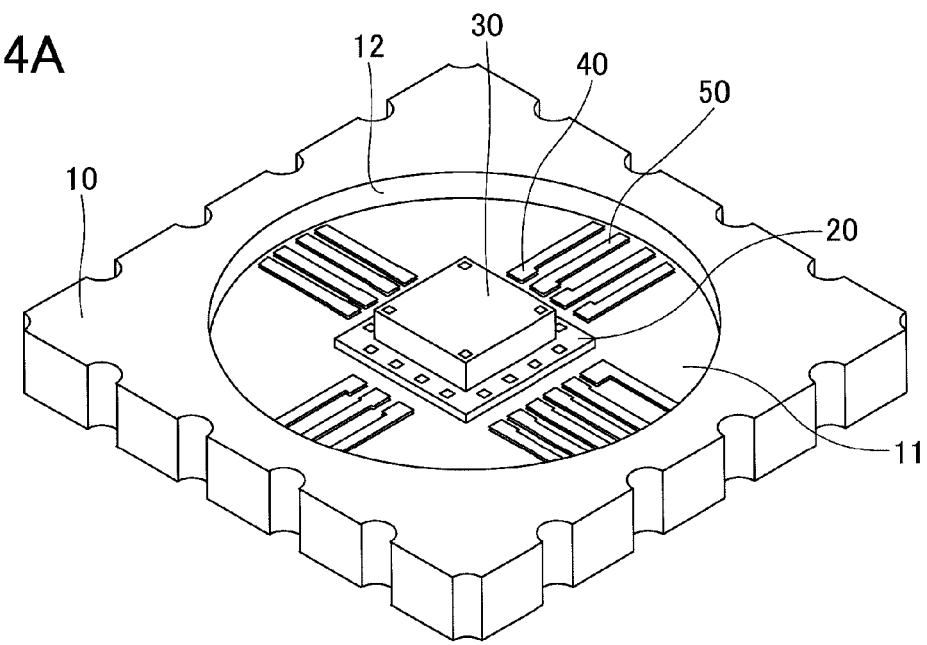
FIG. 4A, FIG. 4B, and FIG. 4C are diagrams illustrating one example of a semiconductor sensor device according to Practical Example 1 of the present invention.
Figure 4B:
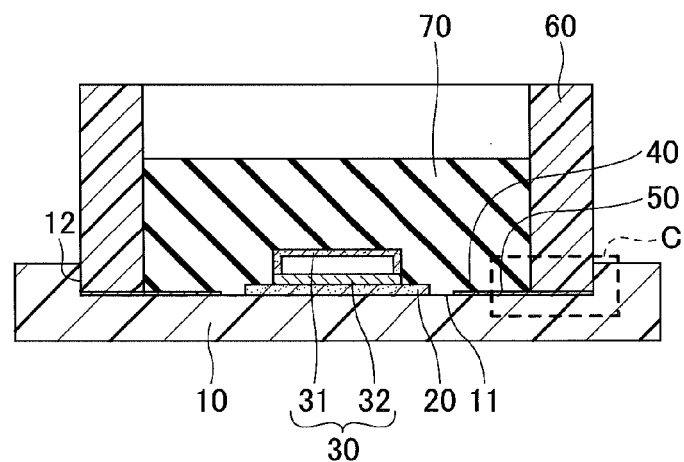
Figure 4C:
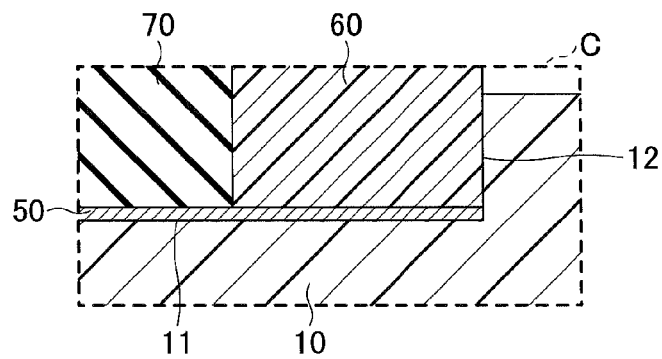

FIG. 4A, FIG. 4B, and FIG. 4C are diagrams illustrating one example of a semiconductor sensor device according to Practical Example 1 of the present invention. FIG. 4A is a perspective view illustrating a substrate and a mounted component of the one example of a semiconductor sensor device according to Practical Example 1, FIG. 4B is a cross-sectional view of the one example of a semiconductor sensor device according to Practical Example 1, and FIG. 4C is an enlarged view of a broken line area C in FIG. 4B.

In FIG. 4A, a substrate 10 of a semiconductor sensor device according to Practical Example 1 and components mounted on the substrate 10 are illustrated. The substrate 10 has a circular recess 11 on a central area thereof. The recess 11 is an area configured to have a surface height less than that of a surface of the substrate 10 and a step is provided thereon to form a side face 12, so that it is possible to position a cylinder and increase a contact area between the cylinder and the substrate 10.

In the recess 11, a control IC and a sensor element 30 are mounted, and further, pads 40 and wirings 50 are formed around the control IC 20 and the sensor element 30. Whereas the control IC 20 and the sensor element 30 are mounted on the recess 11 of the substrate 10 by using an adhesive, etc., the pads 40 and the wirings 50 are formed on a surface of the recess 11 as metallic patterns. The pads 40 are formed adjacent to and around the control IC 20 and the sensor element 30, and the wiring 50 is formed to extend from a pad 40 to an outside thereof.

As illustrated in FIG. 4B, the sensor element 30 and the control IC 20 are surrounded by a cylindrical cylinder 60, and a sealing material 70 fills and seals an inside of the cylinder 60 to be protected from external dirt, dust, etc. As illustrated in a broken line area C in FIG. 4B, the cylinder 60 is positioned to mate with the recess 11 of the substrate 10. Furthermore, not only a ring-shaped bottom face but also a side face near a bottom portion of the cylinder 60 contacts a side face 12 of the recess 11, and hence, a contact area also increases, so that a configuration is provided in such a manner that it is possible to increase an adhesion strength.

In FIG. 4C, an enlarged view of the broken line area C in FIG. 4B is illustrated, wherein the wiring 50 extends under the cylinder 60. This is because the recess 11 is formed to correspond to an outer diameter of the cylinder 60 and formed to enclose the cylinder 60 so that it is possible to configure a horizontal area within an outer diameter of the cylinder 60. Furthermore, as illustrated in FIG. 4C, a configuration is provided in such a manner that, due to a step having the side face 12, positioning of the cylinder 60 is readily conducted, and due to contact between a outer side face of a bottom portion of the cylinder 60 and the side face 12, a contact area increases so that a bonding strength between the cylinder 60 and the substrate 10 is also improved.

Figure 1A:
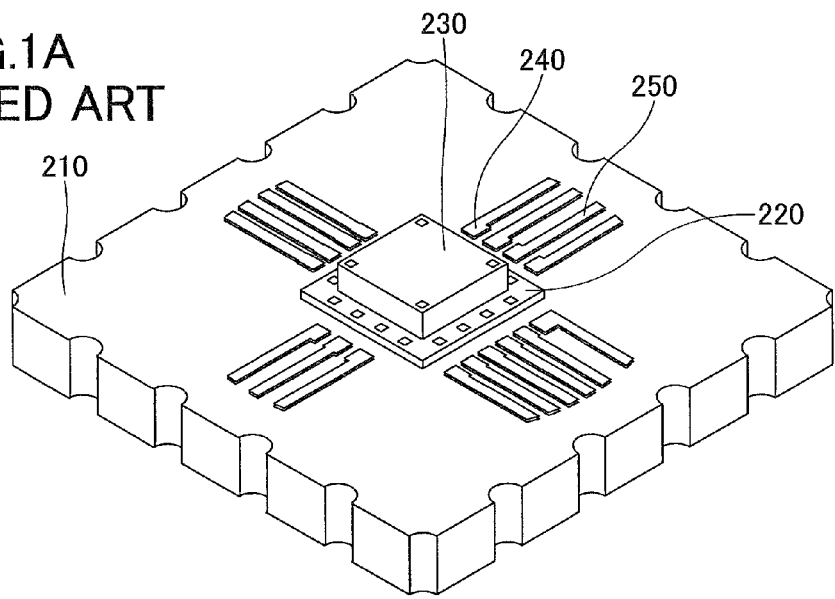
FIG. 1A, FIG. 1B, and FIG. 1C are diagrams illustrating a conventional semiconductor sensor device assembled by using a positioning jig.
Figure 1B:
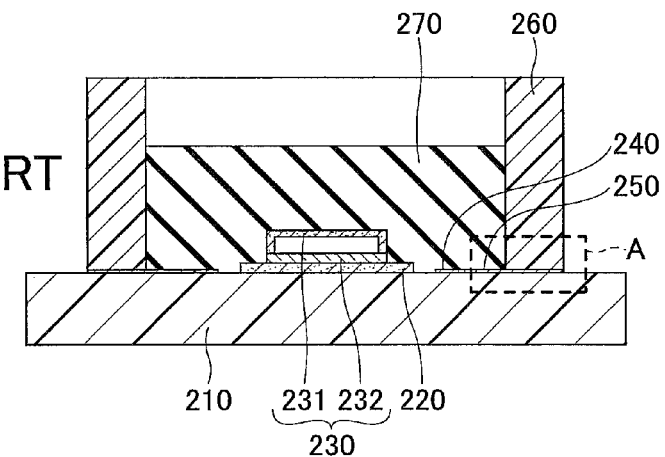
Figure 1C:
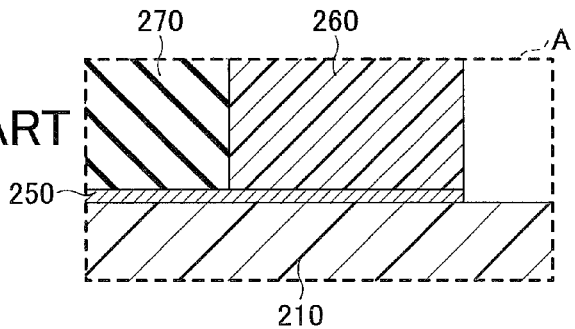
Figure 2:
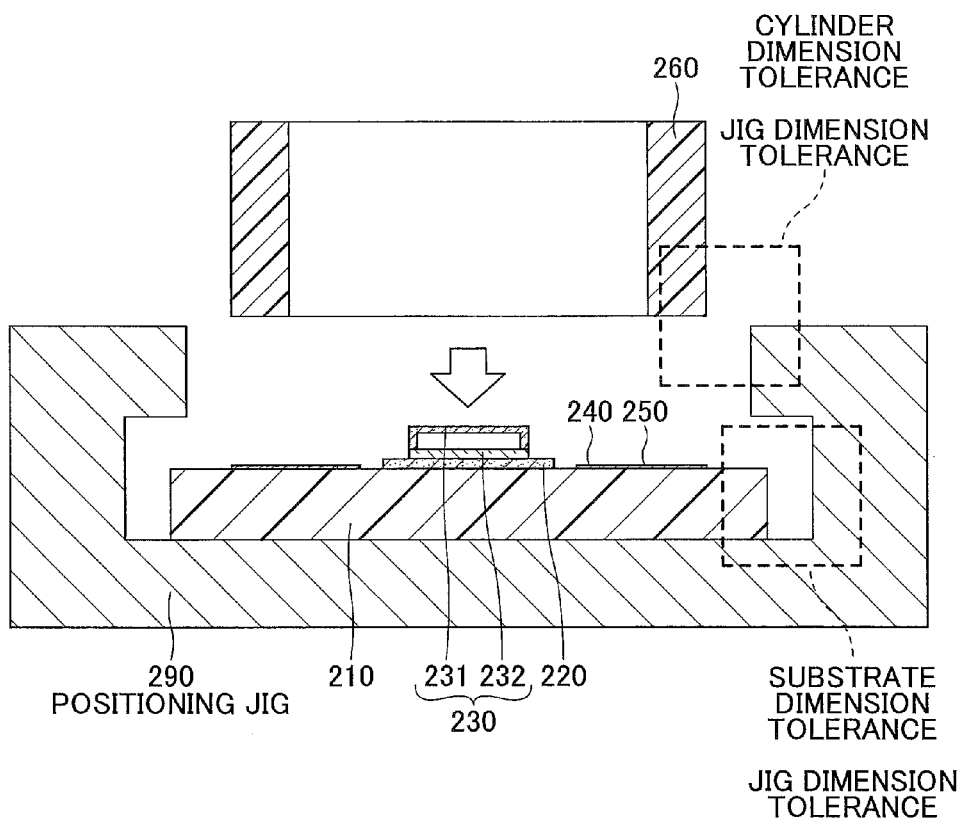
FIG. 2 is a diagram illustrating a method for mounting a cylinder of the conventional semiconductor device illustrated in FIG. 1A, FIG. 1B, and FIG. 1C.
Figure 3A:
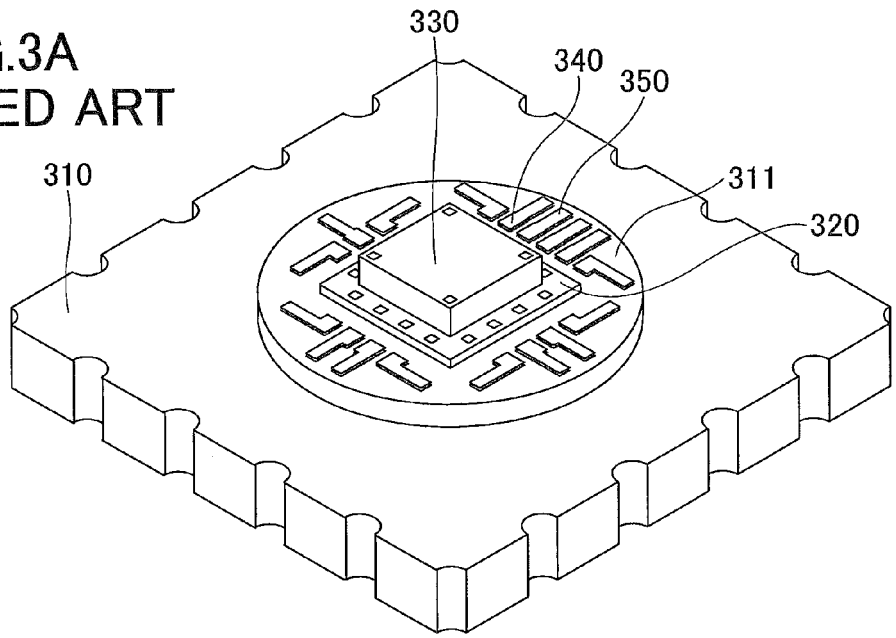
FIG. 3A, FIG. 3B, and FIG. 3C are diagrams illustrating a conventional semiconductor sensor device using a convex-shaped substrate.
Figure 3B:
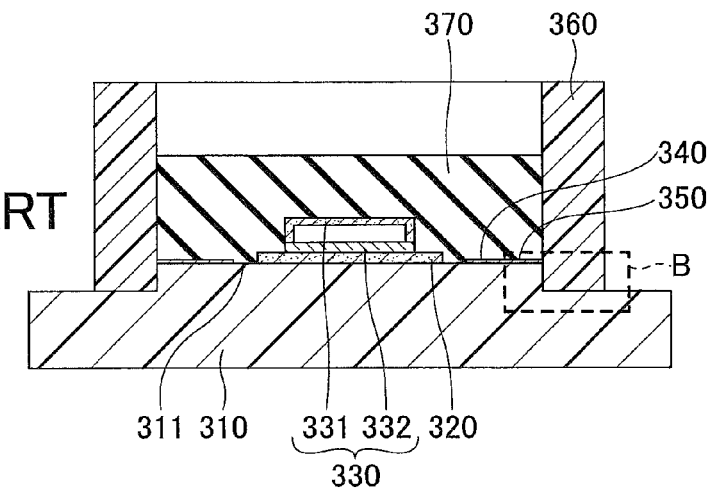
Figure 3C:
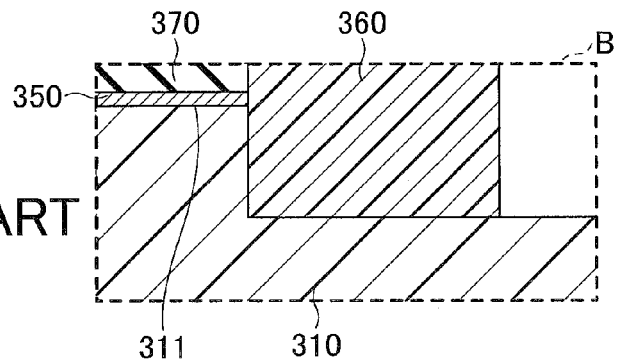
Figure 5:
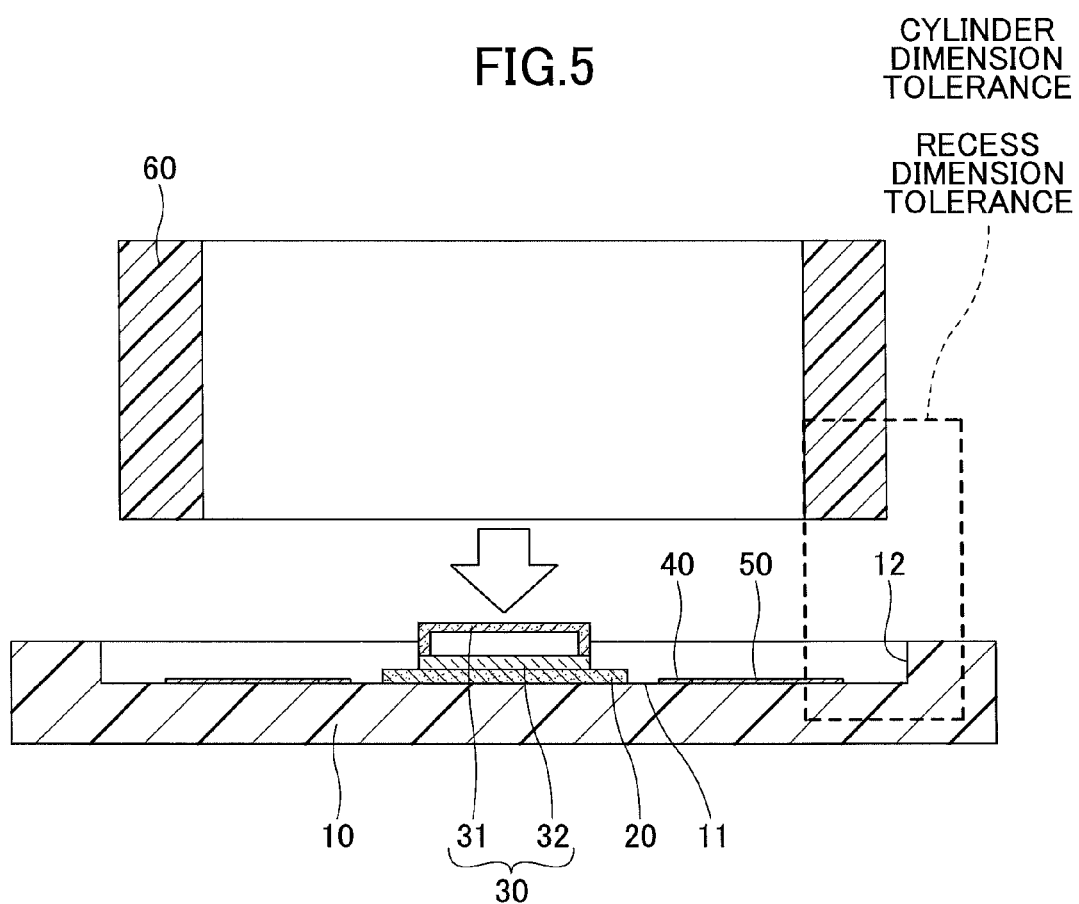
FIG. 5 is a diagram illustrating an error originating from a dimension tolerance of a semiconductor sensor device according to Practical Example 1 of the present invention.

FIG. 5 is a diagram illustrating an error originating from a dimension tolerance of a semiconductor sensor device according to Practical Example 1 of the present invention. As illustrated in FIG. 5, a semiconductor sensor device according to Practical Example 1 does not utilize a positioning jig but utilizes a step between the recess 11 and a surface of the substrate 10 at time of mounting of the cylinder 60, and hence, only an error originating from a dimension tolerance of the cylinder 60 and an error originating from a dimension tolerance of the recess 11 of the substrate 10 influence positioning of the cylinder 60. Hence, it is possible to conduct positioning of the cylinder 60 at improved precision. This matter is a matter that is greatly different from conventional mounting of the cylinder 260 using the positioning jig 290 as illustrated in FIG. 2.

Figure 6:
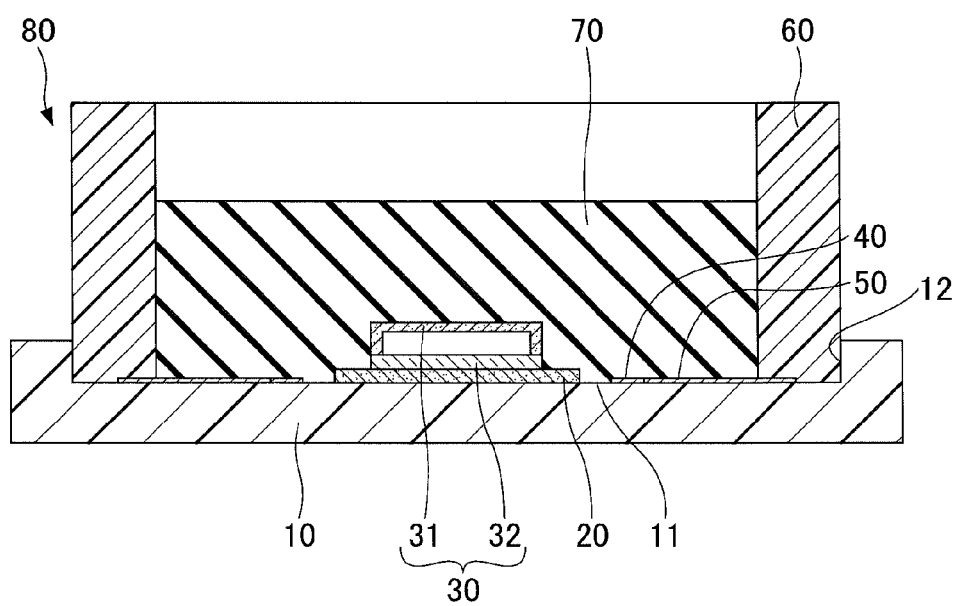
FIG. 6 is a cross-sectional view illustrating one example of a semiconductor sensor device according to Practical Example 1 of the present invention.

FIG. 6 is a cross-sectional view illustrating one example of a semiconductor sensor device according to Practical Example 1 of the present invention. In FIG. 6, a semiconductor sensor device 80 according to Practical Example 1 includes a substrate 10, a control IC 20, a sensor element 30, a pad 40, a wiring 50, a cylinder 60, and a sealing material 70. Furthermore, the sensor element 30 has a diaphragm 31 and a support 32.

As illustrated in FIG. 6, the control IC 20 is mounted in the recess 11 of the substrate 10 and the sensor element 30 is mounted on the control IC 20, so as to have a configuration in which the control IC 20 and the sensor element 30 are laminated, and the control IC 20 and the sensor element 30 are mounted on the substrate 10 so that a surface area of a semiconductor sensor device is reduced. Furthermore, the pad 40 is formed on a surface adjacent to an outside of the control IC 20 and the sensor element 30 in the recess 11, and the wiring 50 is formed outside of the pad 40. The wiring 50 extends under the cylinder 60. The recess 11 is formed as a counterbored hole, and positioning of the cylinder 60 is facilitated due to a step at a surface of an unprocessed portion of the substrate 10 so that stabilization of the cylinder 60 is improved. Furthermore, the recess 11 has a side face 12 that contacts a peripheral face of a bottom portion of the cylinder 60, and hence, it is possible to increase a contact area between the substrate 10 and the cylinder 60 so as to improve a bonding strength of them.

The cylinder 60 is positioned by having an outer side face of a bottom portion thereof contacting the side face 12 of the recess 11 due to a step of the recess 11. The cylinder 60 is a hollow member whose top face is not present and is opened, and an inside thereof is filled with the sealing material 70. The sealing material 70 covers and seals the control IC 20 and the sensor element 30 so that these are protected.

Next, the individual components will be described in more detail.

The substrate 10 may be made of a variety of insulators or semiconductors, and for example, a ceramic substrate made of a ceramic may used. Besides, it is also possible to use a resinous substrate, a silicon substrate, etc.

The control IC 20 is an IC for controlling the sensor element 30 and is provided according to need. Additionally, the control IC 20 may be provided outside the cylinder 60 and may not necessarily be a component of a semiconductor sensor device.

The sensor element 30 is an element for detecting a physical quantity according to a purpose thereof and may have a variety of configurations according to an application thereof. In FIG. 4A, FIG. 4B, and FIG. 4C, the sensor element 30 has a diaphragm 31 and a supporter 32, wherein an example configured as a pressure sensor element for detecting a pressure is illustrated. The diaphragm 31 is an element capable of deforming physically depending on a pressure to detect such a pressure from an amount of deformation thereof. The supporter 32 is a member for supporting the diaphragm 31. The diaphragm 31 is composed of a semiconductor, such as silicon, which deforms depending on a pressure. Furthermore, as long as the diaphragm 31 is supported, the supporter 32 may be made of a variety of materials, and may be made of, for example, a glass, silicon, etc. Thus, the sensor element 30 is configured as a semiconductor sensor using a semiconductor.

Additionally, although a configuration in which the control IC 20 and the sensor element 30 are laminated is illustrated in FIG. 6, the control IC 20 and the sensor element 30 may be arranged in parallel horizontally and placed on a plane in the recess 11. Furthermore, the control IC 20 may not necessarily be provided in the recess 11 as described above.

The pad 40 is connected to input and output terminals of the sensor element 30 and/or the control IC 20 by a bonding wire, etc., and is a terminal for conducting electrical connection with an exterior thereof. Furthermore, the wiring 50 is provided for further drawing electrical connection from the pad 40 outward. Hence, electrical connection of the sensor element 30 and/or the control IC 20 with an exterior is attained by the pad 40 and the wiring 50.

The cylinder 60 encloses the control IC 20, the sensor element 30, the pad 40, and the wiring 50 and is a housing for holding the sealing material 70. It is possible to configure the cylinder 60 in a variety of shapes as long as a hollow member is provided. In FIG. 4A, FIG. 4B, and FIG. 4C, the cylinder 60 with a circularly cylindrical shape is illustrated as one example. It is possible to use a variety of materials for the cylinder 60, wherein, for example, a metallic material such as a stainless steel may be used or a plastic such as a poly (phenylene sulfide) (PPS), a resin, etc., may be used.

The sealing material 70 is a protective member for sealing the control IC 20, the sensor element 30, the pad 40, and the wiring 50. The sealing material 70 fills in a hollow region of the cylinder 60 so that the control IC 20, the sensor element 30, the pad 40, and the wiring 50 are covered and protected. It is possible to use a variety of sealing materials for the sealing material 70 according to an application thereof, wherein, when the sensor element 30 is a pressure sensor element, a pressure is detected via the sealing material 70, and hence, a member having elasticity is used. In this case, for example, a silicon rubber, a silicon gel, etc., may be used for the sealing material 70.

As described above, the recess 11 for positioning the cylinder 60 is provided on a surface of the substrate 10 in the semiconductor sensor device according to Practical Example 1, so that it is possible to facilitate positioning of the cylinder 60 and it is also possible to improve an adhesion strength between the substrate 10 and the cylinder 60.

Next, one example of a method for manufacturing the semiconductor sensor device 80 according to Practical Example 1 of the present invention will be described using FIG. 7A, FIG. 7B, FIG. 7C, FIG. 7D, and FIG. 7E. FIG. 7A, FIG. 7B, FIG. 7C, FIG. 7D, and FIG. 7E are diagrams illustrating one example of a method for manufacturing a semiconductor sensor device according to Practical Example 1. Additionally, in FIG. 7A, FIG. 7B, FIG. 7C, FIG. 7D, and FIG. 7E, a component similar to a component as already described will be provided an identical reference numeral and a description(s) thereof will be omitted.

Figure 7A:
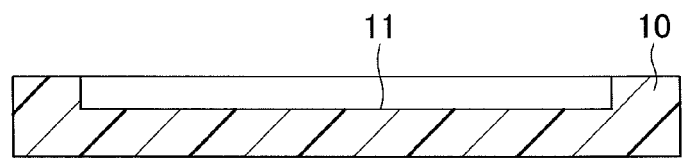
FIG. 7A, FIG. 7B, FIG. 7C, FIG. 7D, and FIG. 7E are diagrams illustrating one example of a method for manufacturing a semiconductor sensor device according to Practical Example 1.

FIG. 7A is a diagram illustrating a process for preparing a substrate in the one example of a method for manufacturing a semiconductor sensor device according to Practical Example 1. In a process for preparing a substrate, the substrate 10 is prepared in which the recess 11 is formed at a center thereof.

Figure 7B:
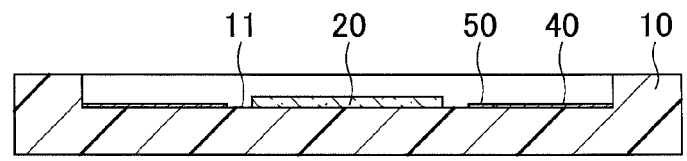

FIG. 7B is a diagram illustrating a process for mounting a control IC in the one example of a method for manufacturing a semiconductor sensor device according to Practical Example 1. In a process for mounting a control IC, the control IC 20 is mounted in the recess 11 of the substrate 10. Additionally, the control IC 20 may be, for example, connected to an inside of the recess 11 of the substrate 10 by using an adhesive, etc.

Figure 7C:
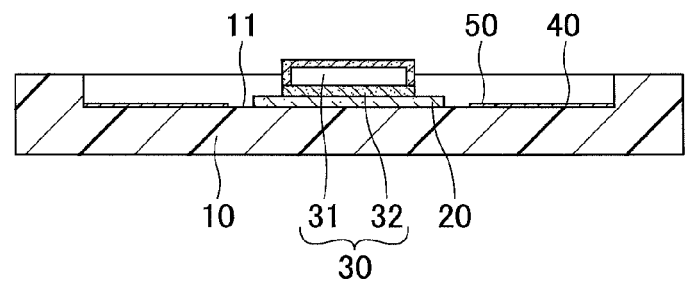

FIG. 7C is a diagram illustrating a process for mounting a sensor element in the one example of a method for manufacturing a semiconductor sensor device according to Practical Example 1. In a process for mounting a sensor element, the sensor element 30 is mounted in the recess 11 of the substrate 10. Mounting of the sensor element 30 may be conducted by, for example, being connected to the recess 11 using an adhesive, similarly to mounting of the control IC 20. Additionally, although an example in which the sensor element 30 is laminated and mounted on the control IC 20 is illustrated in FIG. 7C, the sensor element 30 may be juxtaposed to the control IC 20 and arranged in parallel to the substrate 10. It is possible to provide a variety of configurations and arrangements of components inside the cylinder 60 according to an application thereof. However, a laminate structure as illustrated in FIG. 7C is adopted so that it is possible to reduce a surface area for arranging components of the semiconductor sensor device 80 and miniaturize the semiconductor sensor device 80.

Additionally, connection with the pad 40 by wire bonding, etc., is conducted in the process for mounting a control IC and a process for mounting a sensor element, according to need.

Figure 7D:
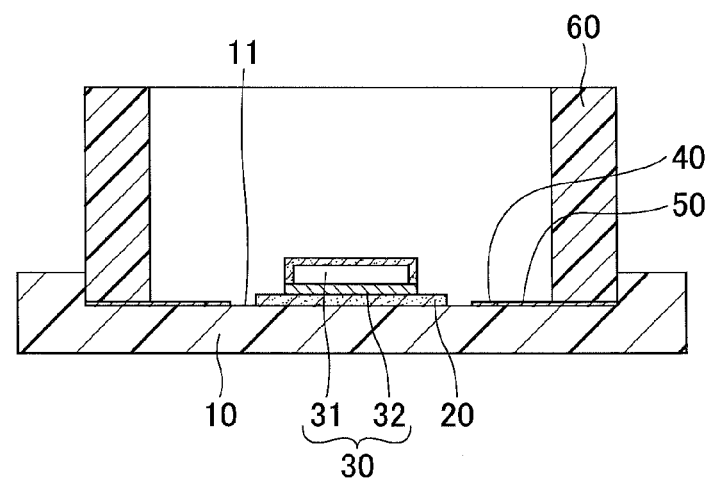

FIG. 7D is a diagram illustrating a process for mounting a cylinder in the one example of a method for manufacturing a semiconductor sensor device according to Practical Example 1. In a process for mounting a cylinder, the cylinder 60 is positioned and arranged by the recess 11 and bonded to a surface of the substrate 10 by an adhesive, etc. Then, due to a step with respect to a surface of a non-recess portion of the substrate 10 as provided by the recess 11, a side face of a bottom portion of the cylinder 60 contacts the side face 12 of the recess 11 so that the cylinder 60 is readily positioned. Furthermore, an outer side face of a bottom portion of the cylinder 60, as well as a ring-shaped bottom face of the cylinder 60, contacts the side face 12 of the recess 11, and hence, a contact area increases, so that it is possible to improve a bonding strength between the cylinder 60 and the substrate 10.

Figure 7E:
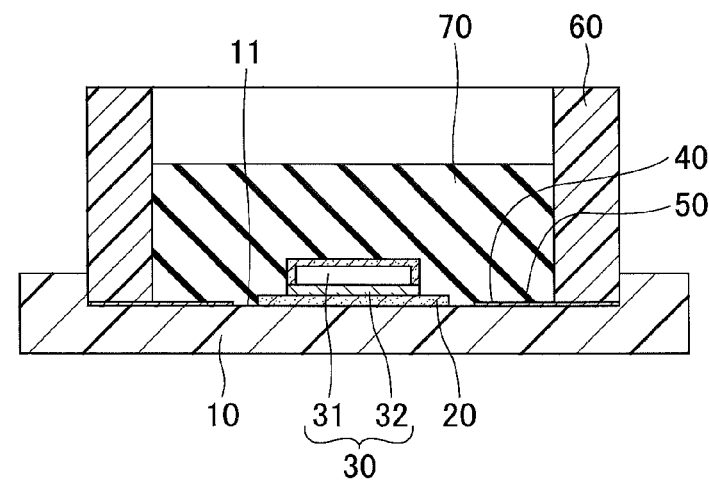

FIG. 7E is a diagram illustrating a sealing process in the one example of a method for manufacturing a semiconductor sensor device according to Practical Example 1. In a sealing process, a sealing material 70 fills in the cylinder 60, and the sensor element 30 and the control IC 20 are covered and sealed with the sealing material 70.

Thus, according to a method for manufacturing a semiconductor sensor device according to Practical Example 1, it is possible to readily conduct mounting of the cylinder 60 and obtain a semiconductor sensor device with an improved strength, by using the substrate 10 on which the recess 11 is formed.

Practical Example 2

Figure 8A:
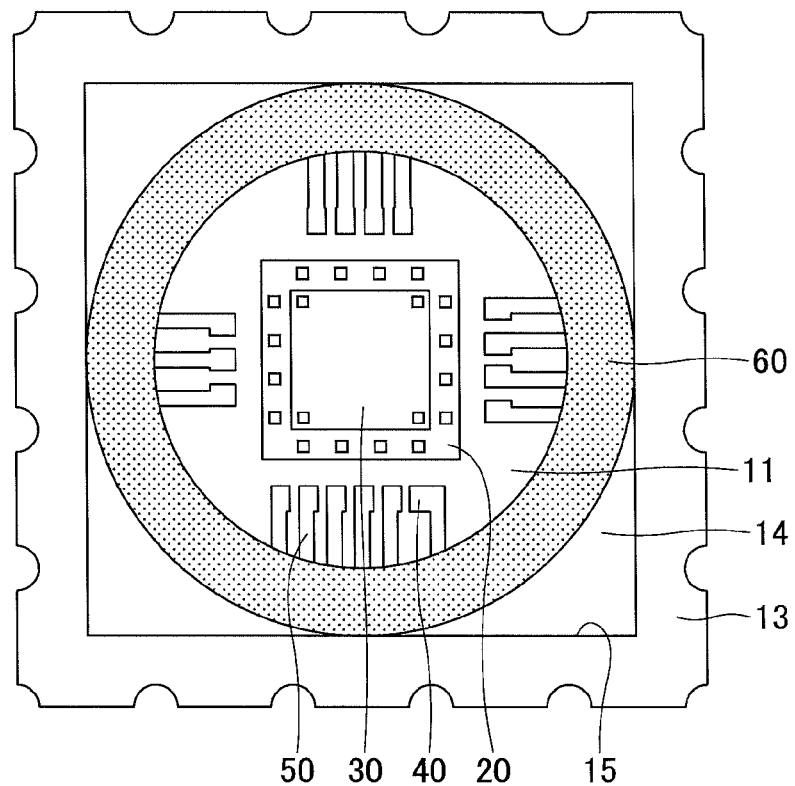
FIG. 8A and FIG. 8B are diagrams illustrating one example of a semiconductor sensor device according to Practical Example 2 of the present invention.
Figure 8B:
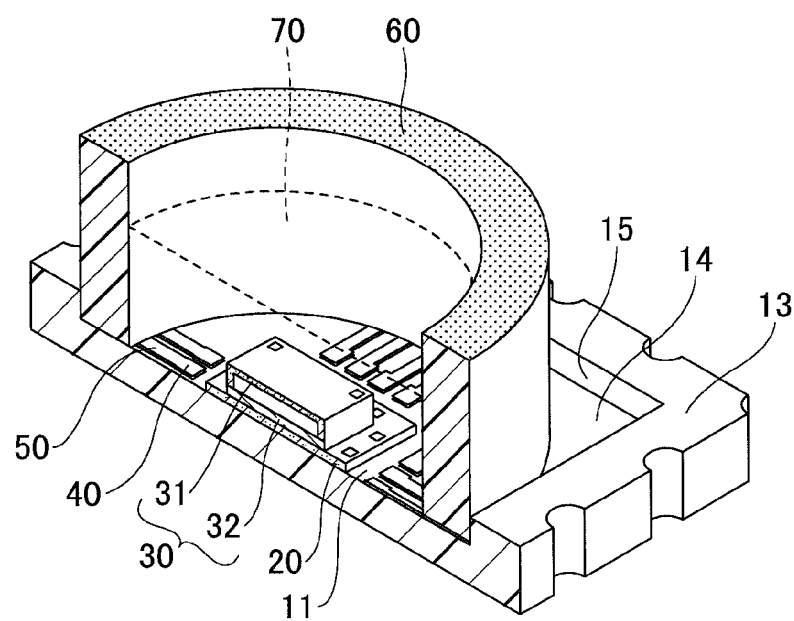

FIG. 8A and FIG. 8B are diagrams illustrating one example of a semiconductor sensor device according to Practical Example 2 of the present invention. FIG. 8A is a plan view of the semiconductor sensor device according to Practical Example 2 and FIG. 8B is a perspective cross-sectional view of the semiconductor sensor device according to Practical Example 2.

In FIG. 8A and FIG. 8B, a semiconductor sensor device according to Practical Example 2 is configured in such a manner that a planar shape of a recess 14 of a substrate 13 is a square, and is different from the semiconductor sensor device according to Practical Example 1 in that an entire perimeter of an outer side face of a bottom portion of a cylinder 60 does not completely contact a side face 15 of the recess 14 but the cylinder 60 is inscribed in side faces 15 of the recess 14 with a square shape and contacted at only four points. Thus, shapes of the cylinder 60 and recess 14 may not be identical and the recess 14 circumscribing the cylinder 60 may be formed on the substrate 13. Even in this case, the cylinder 60 is positioned in the recess 14 with a square shape and further an outer side face of a bottom portion of the cylinder 60 also contacts the side face 15 of the recess 14, so that it is possible to improve a bonding strength.

Furthermore, it is possible for a shape of the recess 14 to be configured to be a variety of shapes circumscribing the cylinder 60. For example, the cylinder 60 in Practical Example 2 has a circularly cylindrical shape, and hence, the recess 14 is configured to be a square shape, while, for example, when the cylinder 60 has an elliptical shape, the recess 14 is configured to be a rectangular shape so as to circumscribe the cylinder 60 with an elliptical shape.

Additionally, other components are similar to those of the semiconductor sensor device 80 according to Practical Example 1, and hence, a similar component will be provided with a reference numeral identical to that of Practical Example 1 while a description(s) thereof will be omitted.

Practical Example 3

Figure 9A:
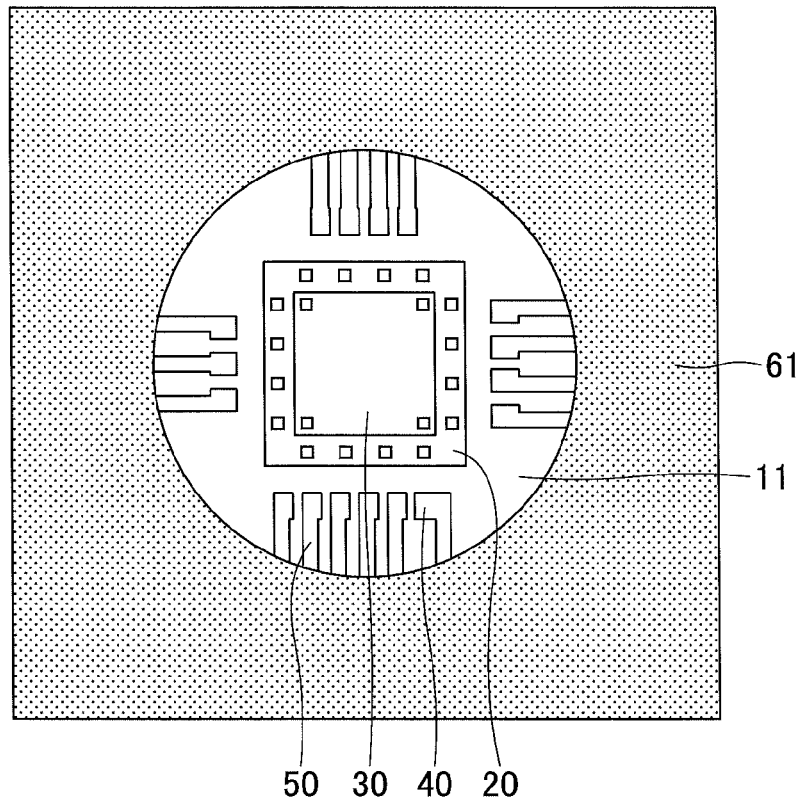
FIG. 9A and FIG. 9B are diagrams illustrating one example of a semiconductor sensor device according to Practical Example 3 of the present invention.
Figure 9B:
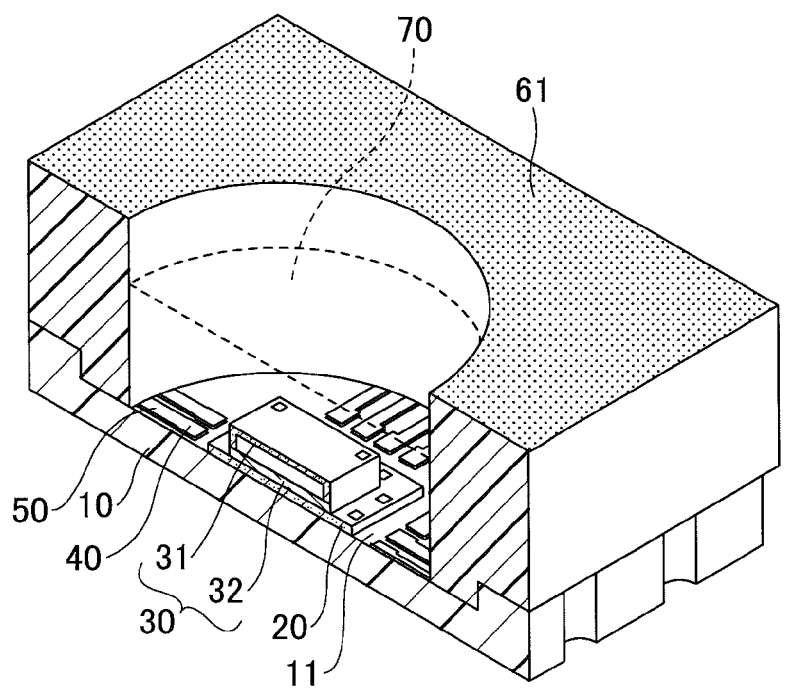

FIG. 9A and FIG. 9B are diagrams illustrating one example of a semiconductor sensor device according to Practical Example 3 of the present invention. FIG. 9A is a plan view of the semiconductor sensor device according to Practical Example 3 and FIG. 9B is a perspective cross-sectional view of the semiconductor sensor device according to Practical Example 3.

In FIG. 9A and FIG. 9B, a semiconductor sensor device according to Practical example 3 is configured in such a manner that a substrate 10 and a recess 11 are similar to those of Practical Example 1 but is different from Practical Examples 1 and 2 in that an outline of a cylinder 61 is not a circularly cylindrical shape but is a rectangular parallelepiped shape and covers an entirety of the substrate 10. Thus, while the recess 11 has a circular shape, only an outline of the cylinder 60 may have a rectangular parallelepiped shape and a shape to cover an entirety of the substrate 10.

Even in this case, a portion of the cylinder 61 that contacts the recess 11 has a circularly cylindrical shape similar to that of Practical Example 1 and has a shape in such a manner that an outer side face of a bottom portion thereof contacts a side face 12 of the recess 11, so that it is possible to conduct positioning and bonding of the cylinder 61 similarly to Practical Example 1. Furthermore, the cylinder 61 covers an entirety of an outside of the substrate 10 so that a contact area of the cylinder 61 with the substrate 11 further increases. Hence, it is possible to readily conduct positioning similarly to Practical Example 1 and it is possible to further increase a bonding strength. Thus, according to the semiconductor sensor device according to Practical Example 3, it is possible to retain a facility of positioning at time of mounting of the cylinder 61 and further improve a bonding strength with the substrate 10.

Additionally, other components are similar to those of the semiconductor sensor device 80 according to Practical Example 1, and hence, a reference numeral similar to that of Practical Example 1 will be used to omit a description(s) thereof.

Practical Example 4

Figure 10A:
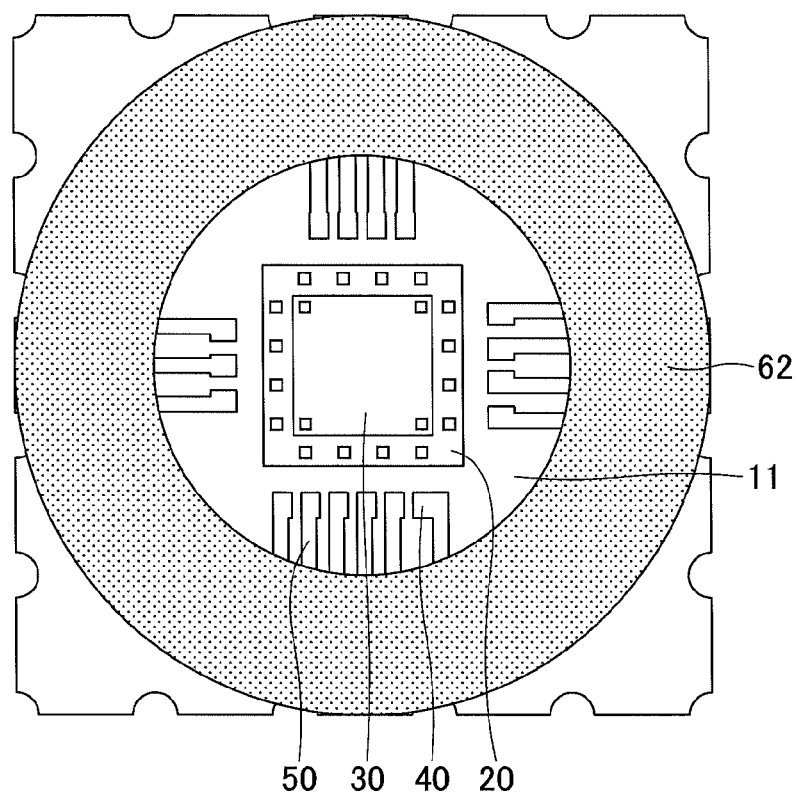
FIG. 10A and FIG. 10B are diagrams illustrating one example of a semiconductor sensor device according to Practical Example 4 of the present invention.
Figure 10B:
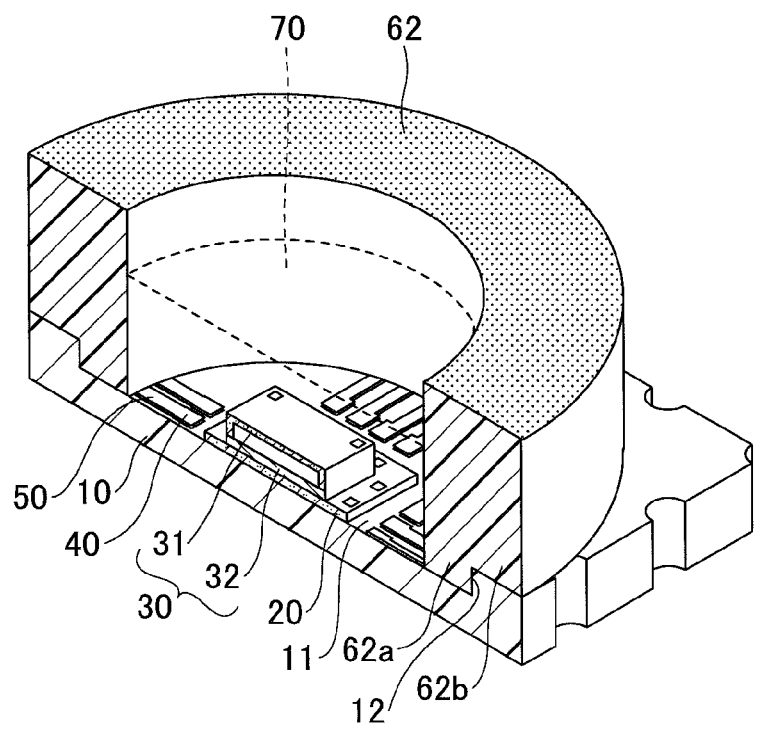

FIG. 10A and FIG. 10B are diagrams illustrating one example of a semiconductor sensor device according to Practical Example 4 of the present invention. FIG. 10A is a plan view of the semiconductor sensor device according to Practical Example 4 and FIG. 10B is a perspective cross-sectional view of the semiconductor sensor device according to Practical Example 4.

In FIG. 10A and FIG. 10B, a semiconductor sensor device according to Practical Example 4 is configured in such a manner that a substrate 10 and a recess 11 are similar to those of Practical Example 1 but is different from Practical Example 1 in that a periphery of a top portion of a cylinder 62 is not a circularly cylindrical shape contained in the recess 11 but is an overhanging portion 62b having a circularly cylindrical shape with a diameter greater than that of the recess 11 to cover an area other than the recess 11 of the substrate 10. On the other hand, a bottom portion 62a of the cylinder 62 has a diameter contacting a side face 12 of the recess 11 similarly to Practical Example 1 so that it is possible to readily position the cylinder 62 similarly to Practical Example 1.

Thus, in order to improve a strength of the cylinder 62 to improve a strength of an entirety of the semiconductor sensor device, an outline of a top portion of the cylinder 62 may be configured to be greater than that of the recess 11. Furthermore, in the semiconductor sensor device according to Practical Example 4, a bottom face of the overhanging portion 62b of the cylinder 62 covers a surface of the substrate 10 and a contact area between the substrate 10 and the cylinder 62 increases, so that it is possible to improve a bonding strength more than the semiconductor sensor device according to Practical Example 1.

Additionally, other components are similar to those of the semiconductor sensor device 80 according to Practical Example 1, and hence, a reference numeral similar to that of Practical Example 1 will be used to omit a description(s) thereof.

Practical Example 5

Figure 11A:
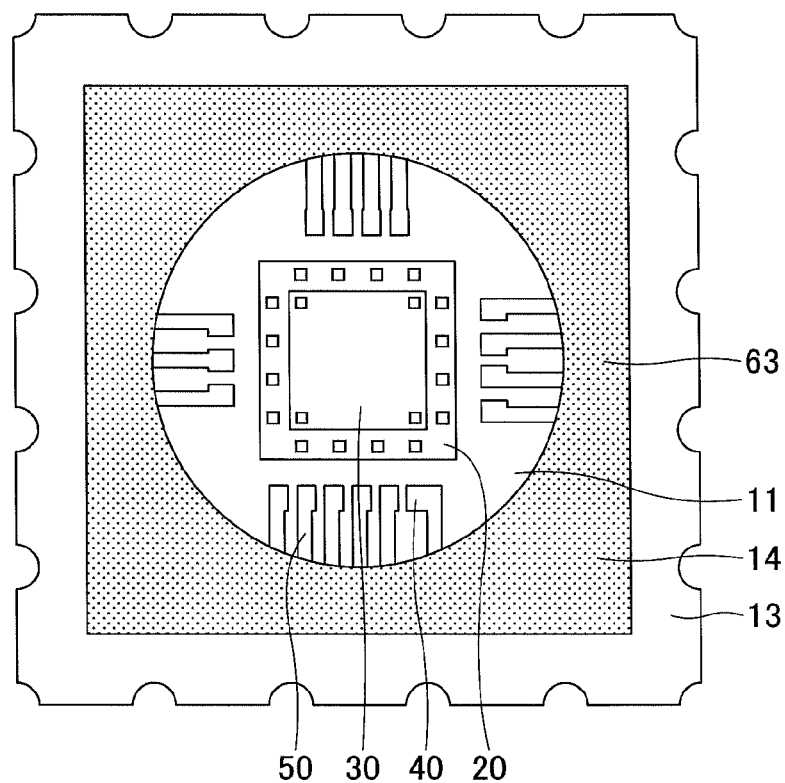
FIG. 11A and FIG. 11B are diagrams illustrating one example of a semiconductor sensor device according to Practical Example 5 of the present invention.
Figure 11B:
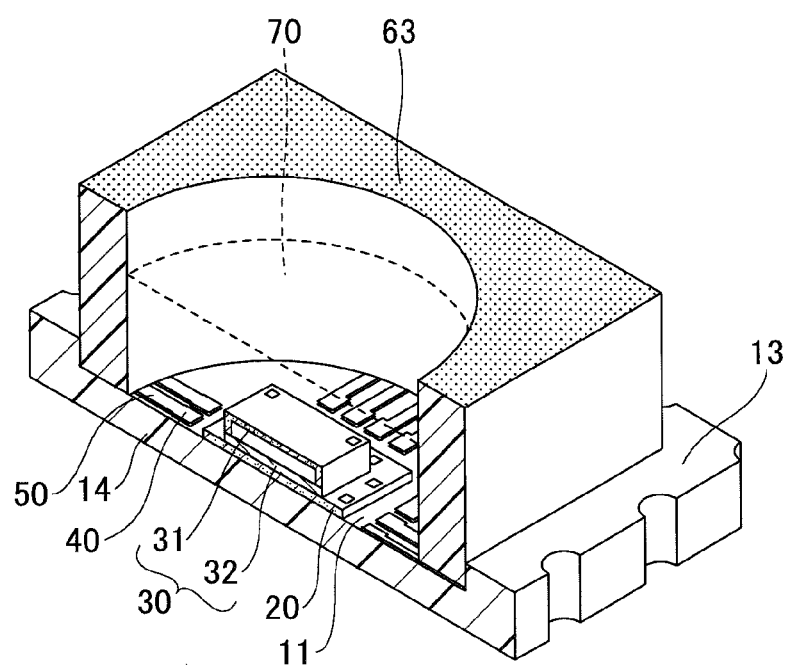

FIG. 11A and FIG. 11B are diagrams illustrating one example of a semiconductor sensor device according to Practical Example 5 of the present invention. FIG. 11A is a plan view of the semiconductor sensor device according to Practical Example 5 and FIG. 11B is a perspective cross-sectional view of the semiconductor sensor device according to Practical Example 5.

In FIG. 11A and FIG. 11B, a semiconductor sensor device according to Practical Example 5 is configured in such a manner that a substrate 13 and a recess 14 are similar to those of the semiconductor sensor device according to Practical Example 2 but is different from the semiconductor sensor device according to Practical Example 2 in that an outline of a cylinder 63 is configured to be a square shape so as to coincide with and be contained in the recess 14 with a square shape.

Thus, outlines of the recess 14 of the substrate 13 and cylinder 63 may be configured to be square shapes and configured to contact an outer side face of a bottom portion of the cylinder 63 and an entirety of a perimeter of a side face 15 of the recess 14. Entireties of mutual side faces are used, so that it is possible to conduct positioning at improved precision and it is possible to increase a contact area between the substrate 13 and an outer side face of a bottom portion of the cylinder 63 to obtain an effect similar to that of Practical Example 1.

Additionally, other components are similar to those of the semiconductor sensor device 80 according to Practical Example 1, and hence, a reference numeral similar to that of Practical Example 1 will be used to omit a description(s) thereof.

Thus, as described in Practical Examples 1-5, it is possible for shapes of the recesses 11 and 14 and cylinders 60-63 to be a variety of combinations thereof according to applications thereof.

Practical Example 6

Figure 12:
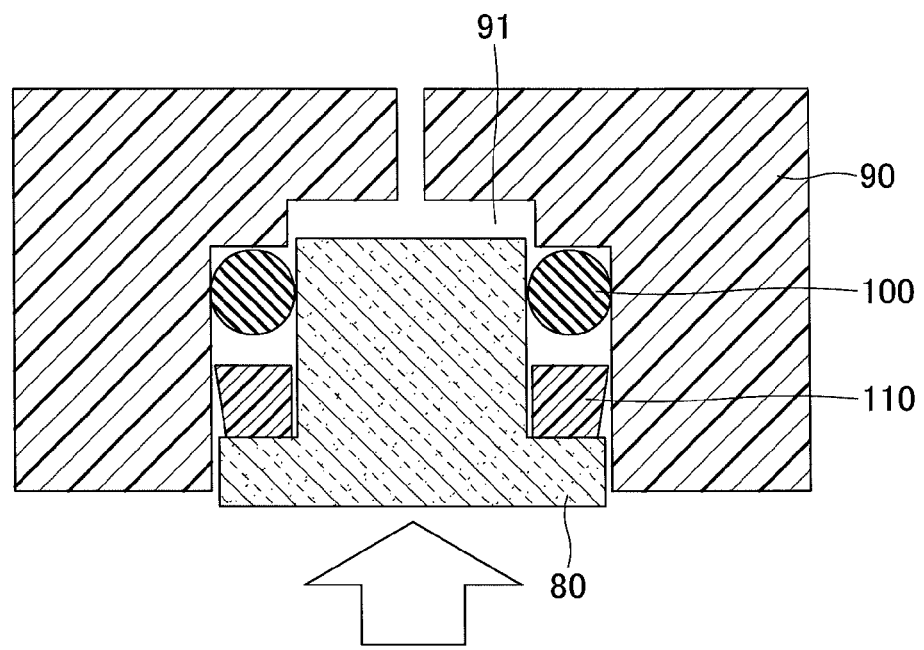
FIG. 12 is a diagram illustrating one example of an electronic apparatus according to Practical Example 6 of the present invention.

FIG. 12 is a diagram illustrating one example of an electronic apparatus according to Practical Example 6 of the present invention. In Practical Example 6, an example is described in which a semiconductor sensor device according to any one of Practical Examples 1-5 is mounted on an electronic apparatus such as a clock or a mobile phone. Although a semiconductor sensor device 80 according to Practical Example 1 is used as a representative example in FIG. 12, it is also possible to mount any one of the semiconductor sensor devices according to Practical Examples 2-5 similarly.

In FIG. 12, an electronic apparatus according to Practical Example 6 has a semiconductor sensor device 80, a housing 90, an O-ring 100, and a back-up ring 110.

The housing 90 is a containment member for an electronic apparatus such as a clock or a mobile phone, and contains a module for conducting a primary function, such as a clock module or a phone module, as well as the semiconductor sensor device 80. The housing 90 has a concave semiconductor sensor device containment part 91 for containing the semiconductor sensor device 80.

The O-ring 100 is provided between a bottom face of the semiconductor sensor device containment part 91 and the semiconductor sensor device 80 and a member for elastically holding the semiconductor sensor device 80 in the semiconductor sensor device containment part 91. The O-ring 100 is composed of, for example, an elastic member such as a rubber.

The back-up ring 110 is a member to be used for back-up of an O-ring and a member provided to prevent the O-ring 100 from greatly deforming to be broken and to loose a sealing property. For the back-up ring 110, for example, a soft plastic, Teflon (registered trademark), etc., may be used.

For example, the O-ring 100 and the back-up ring 110 may be pressed between and contact a peripheral portion of a surface of the substrate 10 or 13 and the concave semiconductor sensor device containment part 91 as illustrated in FIG. 4A, FIG. 4B, and FIG. 4C, FIG. 6, FIG. 8A and FIG. 8B, FIG. 11A and FIG. 11B, etc. The recess 11 or 14 is formed as a counterbored hole, and hence, a thickness of a peripheral portion of a surface of an unprocessed part of the substrate 10 or 13 is greater than the recess 11 or 14 portion. The O-ring 100 and the back-up ring 110 are configured to be pressed against a peripheral portion of the substrate 10 or 13, so that it is possible to ensure strength against stress at a time when the semiconductor sensor device 80 is pressed thereinto.

The semiconductor sensor device 80 is inserted so as to be pressed into the concave semiconductor sensor device containment part 91 and thereby mounted on an electronic apparatus. For example, when the semiconductor sensor device 80 is configured as a pressure sensor, the electronic apparatus is configured as an electronic apparatus with a pressure sensor.

Additionally, although the semiconductor sensor device 80 is generally mounted on a compact and mobile electronic apparatus such as a clock or a mobile phone, a kind of an electronic apparatus is not particularly limited and it is also possible to be applied to a fixedly used one.

Practical Example 7

Figure 13:
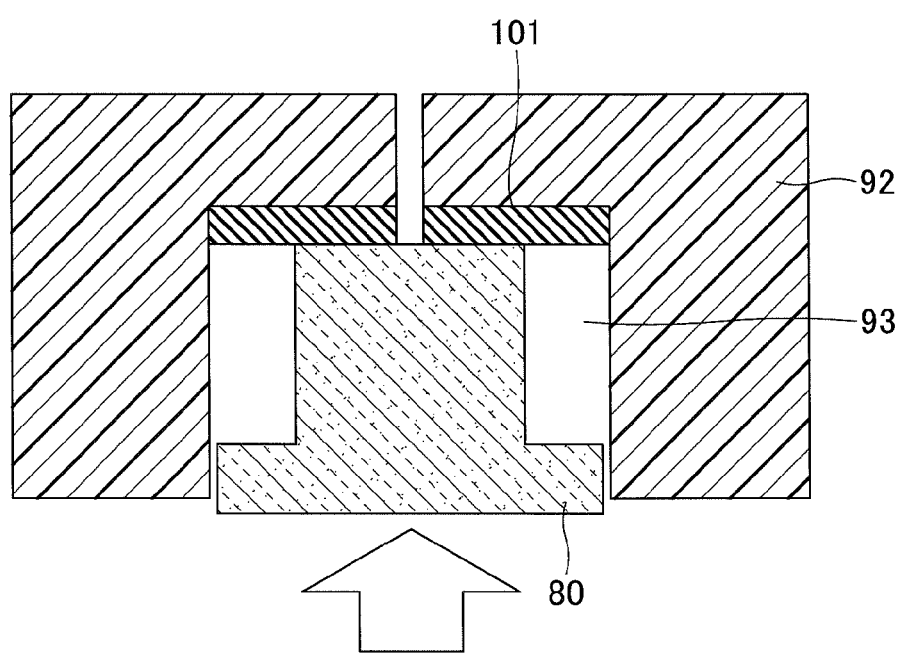
FIG. 13 is a diagram illustrating one example of an electronic apparatus according to Practical Example 7 of the present invention.

FIG. 13 is a diagram illustrating one example of an electronic apparatus according to Practical Example 7 of the present invention. In Practical Example 7, an electronic apparatus with an aspect different from that of Practical Example 6 will be described. Additionally, although the semiconductor sensor device 80 according to Practical Example 1 is used as a representative example in FIG. 13, it being also possible to mount any one of the semiconductor sensor devices according to Practical Examples 2-5 similarly is similar to Practical Example 6.

In FIG. 13, an electronic apparatus according to Practical Example 7 has a semiconductor sensor device 80, a housing 92, and a plate-type rubber 101. Furthermore, the housing 92 has a concave semiconductor sensor device containment part 93.

The electronic apparatus according to Practical Example 7 is also common to that of Practical Example 6 in that the plate-type rubber 101 having a through-hole at a center thereof is provided as an elastic member on a bottom face of the concave semiconductor sensor device containment part 93 and the semiconductor sensor device 80 is pressed and inserted into the concave semiconductor device containment part 93. While the O-ring 100 is used in Practical Example 6, Practical Example 7 is different from Practical Example 6 in that a disk-shaped plate-type rubber 101 is used. The plate-type rubber 101 being provided between the concave semiconductor sensor device containment part 93 and the semiconductor sensor device 80 and elastically supporting the semiconductor sensor device 80 is similar to those of Practical Example 6.

Thus, the semiconductor sensor device 80 may be mounted on the electronic apparatus by using the plate-type rubber 101. For a method for mounting on the electronic apparatus, it is possible to use a variety of methods according to an application. Furthermore, it is also possible for a kind of the electronic apparatus to be a variety of configurations similarly to Practical Example 6.

Practical Example 8

Figure 14E:
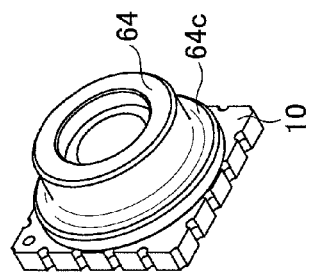
FIG. 14A, FIG. 14B, FIG. 14C, FIG. 14D, and FIG. 14E are diagrams illustrating one example of a semiconductor sensor device according to Practical Example 8 of the present invention.
Figure 14C:
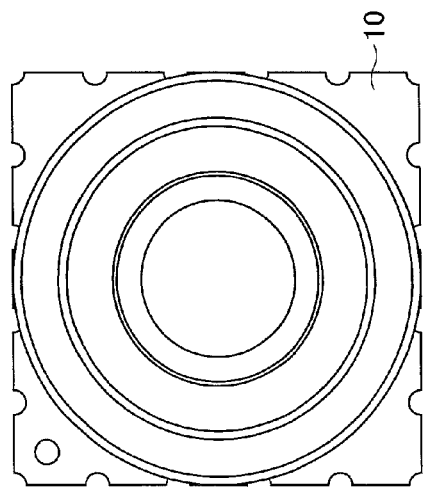
Figure 14D:
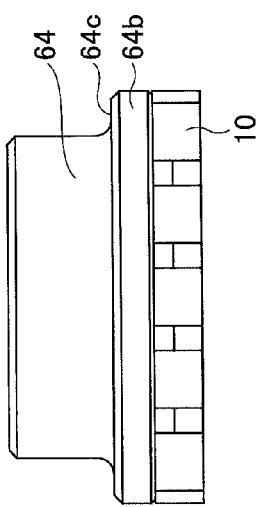
Figure 14A:
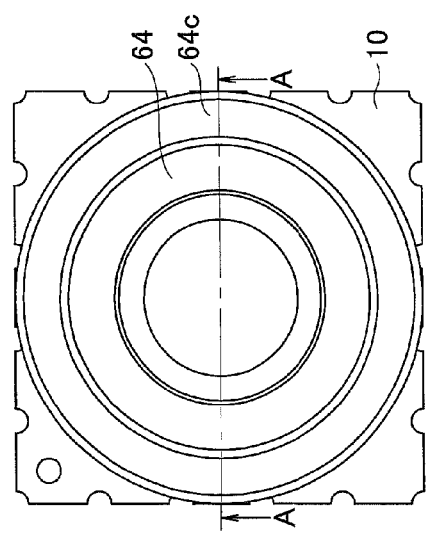
Figure 14B:
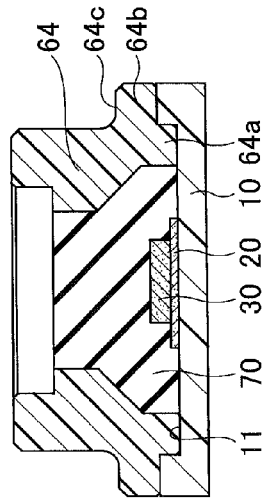

FIG. 14A, FIG. 14B, FIG. 14C, FIG. 14D, and FIG. 14E are diagrams illustrating one example of a semiconductor sensor device according to Practical Example 8 of the present invention. FIG. 14A is a plan view of the semiconductor sensor device according to Practical Example 8 and FIG. 14B is a cross-sectional diagram of a plane provided by cutting in a cross section A-A in FIG. 14A.

As illustrated in FIG. 14A and FIG. 14B, a semiconductor sensor device according to Practical Example 8 is similar to Practical Examples 1-5 with respect to a configuration of a substrate 10, a recess 11, a control IC 20, and a sensor element 30 and in that they are sealed with a sealing material 70. Furthermore, a bottom face of a cylinder 64 having a step, a bottom portion 64a protruding downward and contacting the recess 11 of the substrate 10, and an overhanging portion 64b overhanging outward and covering a peripheral portion of the substrate 10 are similar to those of the semiconductor sensor device according to Practical Example 5 illustrated in FIG. 10A and FIG. 10B. Hence, in the semiconductor sensor device according to Practical Example 8, it is also possible to engage the bottom portion 64a and overhanging portion 64b of the cylinder 64 with the recess 11 of the substrate 10 to conduct positioning properly, similarly to the semiconductor sensor device according to Practical Example 5.

On the other hand, the semiconductor sensor device according to Practical Example 8 is different from the cylinder 62 of the semiconductor sensor device according to Practical Example 5 in that an upper portion of the overhanging portion 64b of the cylinder 64 does not extend to a top of the cylinder 64 constantly to form a circular cylinder at an entire upper portion of the cylinder 64 but is dented inward at the middle thereof to form a stepwise face 64c.

Although the electronic apparatus with the semiconductor sensor device 80 inserted into the housing 90 has been described as Practical Example 6 in FIG. 12, the semiconductor sensor device 80 is held by using the O-ring 100 and the back-up ring 110 in the electronic apparatus according to Practical Example 6 when the semiconductor sensor device 80 is inserted into the concave semiconductor sensor containment part 91 of the housing 90. Herein, the back-up ring 110 is provided by using a soft plastic, Teflon (registered trademark), etc., separately from the semiconductor sensor device 80, in order to prevent the O-ring 100 from greatly deforming to exceed a limit thereof and being broken.

However, the stepwise face 64c of the cylinder 64 plays a role of the back-up ring 110 in the semiconductor sensor device according to Practical Example 8. That is, the stepwise face 64c for pressing the O-ring 100 and suppressing deformation exceeding a limit thereof is formed at an outer side of the cylinder 64, so that it is not required to provide the back-up ring 110. Thus, the stepwise face 64c may be formed at an outer edge portion of the cylinder 64 by taking into consideration a case where the semiconductor sensor device is contained in the housing 90 of the electronic apparatus. The back-up ring 110 is not required so as to reduce the number of components and attain cost reduction and it is not required to insert the back-up ring 110 together with the O-ring 100 at time of assembly, so that handing is facilitated and it is also possible to mitigate labor for assembly.

Additionally, it is possible for the cylinder 64 to be composed of a variety of materials, such as a metallic material such as stainless steel, a plastic such as poly(phenylene sulfide) (PPS), or a resin, according to application thereof, as described above. For example, it is sufficient to configure a shape of the cylinder 64 so as to have the stepwise face 64c integrally formed by using these materials.

FIG. 14C is a plan view of the semiconductor sensor device according to Practical Example 8 and FIG. 14D is a front view corresponding to FIG. 14C. FIG. 14E is a perspective view of the semiconductor sensor device according to Practical Example 8.

As illustrated in FIG. 14C-FIG. 14E, the stepwise face 64c is formed at an outer edge portion of the cylinder 64, and it is possible to understand that a configuration is provided in such a manner that it is possible for the stepwise face 64c to suppress elastic deformation of the O-ring 100 when the semiconductor sensor device according to Practical Example 8 is contained in the housing 90.

Practical Example 9

FIG. 15A, FIG. 15B, FIG. 15C, FIG. 15D, and FIG. 15E are diagrams illustrating one example of a semiconductor sensor device according to Practical Example 9 of the present invention. FIG. 15A is a plan view of the semiconductor sensor device according to Practical Example 9 and FIG. 15B is a cross-sectional diagram of a plane provided by cutting in a cross section A-A in FIG. 15A.

In FIG. 15A and FIG. 15B, a semiconductor sensor device according to Practical Example 9 is different from those of Practical Examples 1-5 and 8 in that a substrate 16 is provided with a shape that does not have a recess 11 and an overhanging portion 65b of a cylinder 65 is formed to protrude under a top face of the substrate 16 and cover an upper portion of a side face of the substrate 16. Furthermore, a bottom portion 65a of the cylinder 65 at an inner side thereof is configured to contact the substrate 16 and cover two faces that are a top face and side face of the substrate 16 at an outer side thereof with inner side faces of the bottom portion 65a and overhanging portion 65b of the cylinder 65 continuously. Thus, the cylinder 65 may be engaged to cover the substrate 16 to conduct positioning of the cylinder 65.

Furthermore, an upper portion of the overhanging portion 65b of the cylinder 65 has a stepwise face 65c similarly to the semiconductor sensor device according to Practical Example 8 and is configured to be capable of suppressing excessive and elastic deformation of an O-ring 100 when being contained in the housing 90 of the electronic apparatus illustrated in FIG. 12. As illustrated in Practical Example 8, the stepwise face 65c has a function similar to that of the back-up ring 110 in FIG. 12 and further, a configuration of an electronic apparatus is simplified as compared to the back-up ring 110 being provided, so that it is possible to attain reduction of a cost for manufacturing and mitigation of labor for assembly.

FIG. 15C is a plan view of the semiconductor sensor device according to Practical Example 9 and FIG. 15D is a front view corresponding to FIG. 15C. FIG. 15E is a perspective view of the semiconductor sensor device according to Practical Example 9.

As illustrated in FIG. 15C-FIG. 15E, the stepwise face 65c is formed at an outer edge portion of the cylinder 65, and it is possible to understand that a configuration is provided in such a manner that it is possible for the stepwise face 65c to suppress elastic deformation of the O-ring 100 when the semiconductor sensor device according to Practical Example 9 is contained in the housing 90.

Additionally, another component is similar to those of Practical Examples 1-5 and 8, and hence, provided with an identical reference numeral to omit a description(s) thereof.

Practical Example 10

Figure 16E:
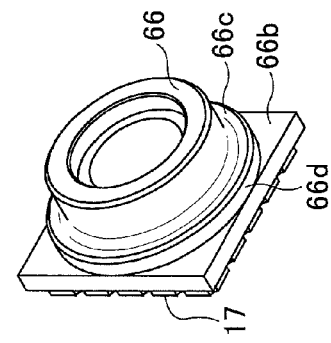
FIG. 16A, FIG. 16B, FIG. 16C, FIG. 16D, and FIG. 16E are diagrams illustrating one example of a semiconductor sensor device according to Practical Example 10 of the present invention.
Figure 16C:
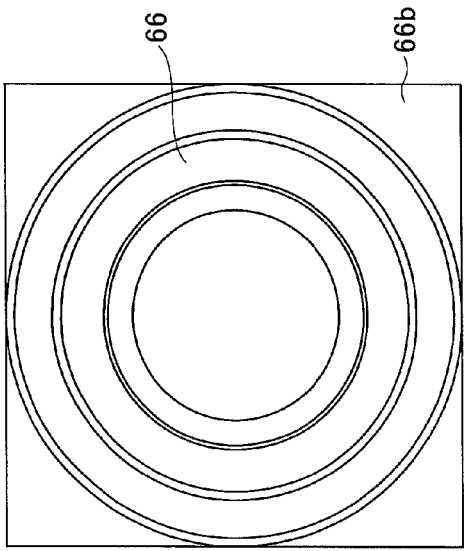
Figure 16D:
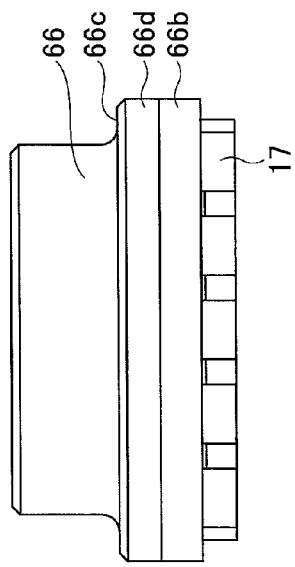
Figure 16A:
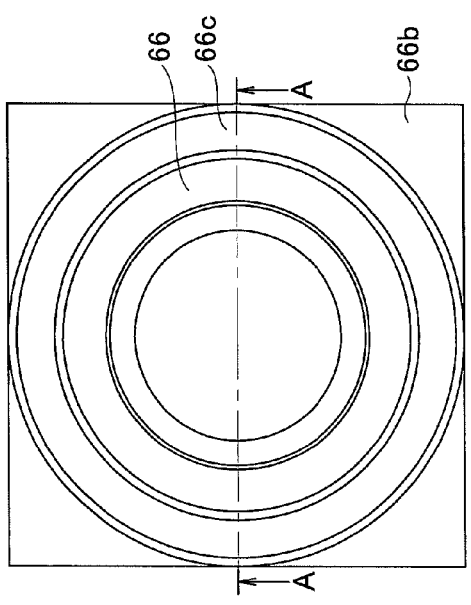
Figure 16B:
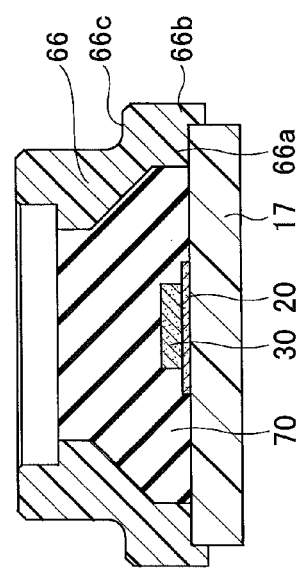

FIG. 16A, FIG. 16B, FIG. 16C, FIG. 16D, and FIG. 16E are diagrams illustrating one example of a semiconductor sensor device according to Practical Example 10 of the present invention. FIG. 16A is a plan view of the semiconductor sensor device according to Practical Example 10 and FIG. 16B is a cross-sectional diagram of a plane provided by cutting in a cross section A-A in FIG. 16A.

In FIG. 16A and FIG. 16B, a semiconductor sensor device according to Practical Example 10 is similar to the semiconductor sensor device according to Practical Example 9 in that a substrate 17 is provided with a shape that does not have a recess 11 and an overhanging portion 66b of a cylinder 66 is formed to protrude under a top face of the substrate 17 and cover an upper portion of a side face of the substrate 17. Furthermore, a bottom portion 66a of the cylinder 66 at an inner side thereof being configured to contact the substrate 17 and cover two faces that are a top face and side face of the substrate 17 at an outer side thereof with inner side faces of the bottom portion 66a and overhanging portion 66b of the cylinder 66 continuously is also similar to that of the semiconductor sensor device according to Practical Example 9. Due to such a configuration, it is possible for the cylinder 66 to cover and engage with the substrate 17 to conduct positioning of the cylinder 66.

That is, the semiconductor sensor device according to Practical Example 10 has a configuration similar to that of the semiconductor sensor device according to Practical Example 9 with respect to a basic configuration thereof. On the other hand, an amount of outward overhanging of the overhanging portion 66b of the cylinder 66 is less than that of the semiconductor sensor device according to Practical Example 9 and a height of a stepwise face 66c at an upper portion of the overhanging portion 66b is greater than that of the semiconductor sensor device according to Practical Example 9.

The stepwise face 66c of the cylinder 66 in the semiconductor sensor device according to Practical Example 10 has a shape with a decreased outward overhanging area and an increased height, and hence, a space for providing an O-ring 100 is reduced, so that it is possible to suppress excessive and elastic deformation of the O-ring 100 with an improved reliability even when the O-ring 100 with a reduced size is used. Furthermore, the back-up ring 110 being not required by providing the stepwise face 66c to attain reduction of a cost of manufacturing and mitigation of labor for assembly is similar to that described in Practical Examples 8 and 9. Thus, it is possible to change shapes of the overhanging portion 66b and stepwise face 66c of the cylinder 66 variously according to an application thereof.

FIG. 16C is a plan view of the semiconductor sensor device according to Practical Example 10 and FIG. 16D is a front view corresponding to FIG. 16C. Furthermore, FIG. 16E is a perspective view of the semiconductor sensor device according to Practical Example 10.

As illustrated in FIG. 16C-FIG. 16E, the overhanging portion 66b of the cylinder 66 in the semiconductor sensor device according to Practical Example 10 overhangs square-like to cover the substrate 17 and a circularly cylindrical overhanging portion 66d is formed thereon to have doubly structured overhanging portions 66b and 66d. Then, the lower overhanging portion 66b is configured to have a surface area greater than that of the substrate 17 so as to cover the substrate 17. Thus, the overhanging portions 66b and 66d of the cylinder 66 may be doubly structured to provide a configuration in such a manner that the plate-type overhanging portion 66b is present between the substrate 17 and the circularly cylindrical overhanging portion 66d.

Thus, it is possible for a configuration of the cylinder 66 to be a variety of configurations according to an application thereof. Additionally, another component is similar to those of Practical Examples 1-5, 8, and 9, and hence, provided with an identical reference numeral to omit a description(s) thereof.

Practical Example 11

FIG. 17A, FIG. 17B, FIG. 17C, FIG. 17D, and FIG. 17E are diagrams illustrating one example of a semiconductor sensor device according to Practical Example 11 of the present invention. FIG. 17A is a plan view of the semiconductor sensor device according to Practical Example 11 and FIG. 17B is a cross-sectional diagram of a plane provided by cutting in a cross section A-A in FIG. 17A.

In FIG. 17A and FIG. 17B, a semiconductor sensor device according to Practical Example 11 is similar to those of Practical Examples 8-10 in that a recess 11 is not formed on a substrate 18, but is different from those of Practical Examples 8-10 in that a structure for engaging a cylinder 67 with the substrate 18 is not formed on a contact face between both of them. On the other hand, the semiconductor sensor device according to Practical Example 11 is common to the semiconductor sensor devices according to Practical Examples 8-10 in that the cylinder 67 has an overhanging portion 67b that overhangs outward and a stepwise face 67c is formed on an upper portion of the overhanging portion 67b. Thus, a structure for positioning the substrate 18 and the cylinder 67 is not particularly provided and a configuration may be provided in such a manner that a shape of the cylinder 67 has the overhanging portion 67b and the stepwise face 67c.

The semiconductor sensor device according to Practical Example 11 has the stepwise face 67c, and hence, it is possible to insert the semiconductor sensor device without using a back-up ring 110 when being inserted into the semiconductor sensor device containment part 91 of the housing 90 of the electronic apparatus illustrated in FIG. 12 is conducted, similarly to the semiconductor sensor devices according to Practical Examples 8-10. That is, the semiconductor sensor device according to Practical Example 11 also has the stepwise face 67c so that it is possible to reduce the number of components to reduce a cost for manufacturing an electronic apparatus and it is possible to reduce labor for attaching the semiconductor sensor device to the housing 90.

FIG. 17C is a plan view of the semiconductor sensor device according to Practical Example 11 and FIG. 17D is a front view corresponding to FIG. 17C. Furthermore, FIG. 17E is a perspective view of the semiconductor sensor device according to Practical Example 11.

As illustrated in FIG. 17C-FIG. 17E, the semiconductor sensor device according to Practical Example 11 has doubly structured overhanging portions 67b and 67d in such a manner that the overhanging portion 67b of the cylinder 67 which portion is slightly smaller than the substrate 18 overhangs generally square-like on the generally square substrate 18 and the circularly cylindrical overhanging portion 67d is formed thereon. That is, a configuration is provided in such a manner that the cylinder 67 having the slightly smaller and lower overhanging portion 67b, the circularly cylindrical overhanging portion 67d, and the stepwise face 67c is laminated on the substrate 18.

The semiconductor sensor device according to Practical Example 11 is similar to the semiconductor sensor device according to Practical Example 10 in that the overhanging portions 67b and 67d of the cylinder 67 have a double structure but is different from the semiconductor sensor device according to Practical Example 10 in that the lower overhanging portion 67b has a surface area less than that of the substrate 18. Thus, it is possible for a configuration of the cylinder 67 to have a variety of configurations according to an application thereof.

Additionally, another component is similar to those of Practical Examples 1-5 and 8-10, and hence, is provided with an identical reference numeral to omit a description(s) thereof.

Practical Example 12

FIG. 18A, FIG. 18B, FIG. 18C, FIG. 18D, FIG. 18E, and FIG. 18F are diagrams illustrating one example of an electronic apparatus according to Practical Example 12 of the present invention. In Practical Example 12, an example of an electronic apparatus configured by using the semiconductor sensor device according to Practical Example 11 will be described. Additionally, an electronic apparatus may be, for example, a clock, a mobile phone, etc., as described in Practical Example 6.

FIG. 18A is a plan view of the electronic apparatus according to Practical Example 12 and FIG. 18B is a cross-sectional diagram of a plane provided by cutting in a cross section A-A in FIG. 18A.

In FIG. 18A and FIG. 18B, an electronic apparatus according to Practical Example 12 has a housing 94, a semiconductor sensor device 81, an O-ring 102, and a base substrate 120.

The housing 94 is a casing for containing the semiconductor sensor device 81 and is configured to be concave by having a dent-shaped semiconductor sensor device containment part 95 in order to keep a space capable of containing the semiconductor sensor device 81. Furthermore, a configuration to have a vent hole 96 at a center thereof and communicate with outside air is provided so that it is possible for the contained semiconductor sensor device 81 to detect a pressure.

The semiconductor sensor device 81 has a configuration similar to that described in Practical Example 11. Additionally, it is not possible to distinguish between overhanging portions 67b and 67d in a cross-sectional configuration illustrated in FIG. 18B, and hence, collective notation and reference numeral are provided as an overhanging portion 67b. A stepwise face 67c at an upper portion of the overhanging portion 67b is configured to press the O-ring 102 and form a space for containing the O-ring 102. A space for containing the O-ring 102 is configured not to generate an increased gap due to a side face of the overhanging portion 67b and a side face of a dent of the housing 94 but to prevent the O-ring 102 from causing excessive and elastic deformation thereof and penetrating into such a gap. Furthermore, a back-up ring 110 is not required, different from Practical Example 6 illustrated in FIG. 12, and hence, a structure of the electronic apparatus is simplified while a configuration for readily conducting attachment of the semiconductor sensor device to the housing 94 is also provided.

The O-ring 102 is provided between a bottom face of the semiconductor sensor device containment part 95 and the semiconductor sensor device 81 so as to hold the semiconductor sensor device 81 in the semiconductor sensor device containment part 95 elastically, and is composed of an elastic member such as, for example, a rubber, as described in Practical Example 6.

The base substrate 120 is a substrate for supporting the semiconductor sensor device 81 via a substrate 18. The semiconductor sensor device 81 is provided on the base substrate 120 and the base substrate 120 is pressed to be moved toward the semiconductor sensor device containment part 95 so that it is possible to contain and hold the semiconductor sensor device 81 in the housing 94.

FIG. 18C is a plan view of the electronic apparatus according to Practical Example 12 and FIG. 18D is a cross-sectional diagram of a plane provided by cutting in a cross section B-B in FIG. 18C.

FIG. 18D illustrates a cross-sectional diagram provided by cutting in a cross section B-B that provides a diagonal line of the housing 94 and is similar to FIG. 18B, wherein there is not a change in a configuration except that the overhanging portion 67b of the cylinder 67, the substrate 18, and the base substrate 120 are transversely longer.

FIG. 18E is a plan view of the electronic apparatus according to Practical Example 12 and FIG. 18F is a front view corresponding to FIG. 18E.

FIG. 18F illustrates that only the lower overhanging portion 67b of the cylinder 67 is exposed and the circularly cylindrical overhanging portion 67d is contained in the housing 94. That is, the semiconductor sensor device 81 has a configuration in such a manner that the generally square overhanging portion 67b contacts the housing 94 to suppress insertion into the semiconductor sensor device containment part 95. Additionally, a configuration may be provided in such a manner that a top face of the cylinder 67 contacts the housing 94 to suppress further insertion into the semiconductor sensor device containment part 95.

Additionally, although an example using the semiconductor sensor device according to Practical Example 1 has been provided and described for the semiconductor sensor device 81 in Practical Example 12, it is also possible to apply any of the semiconductor sensor devices according to Practical Examples 8-10 to the electronic apparatus according to Practical Example 12 similarly.

Practical Example 13

Figure 19A:
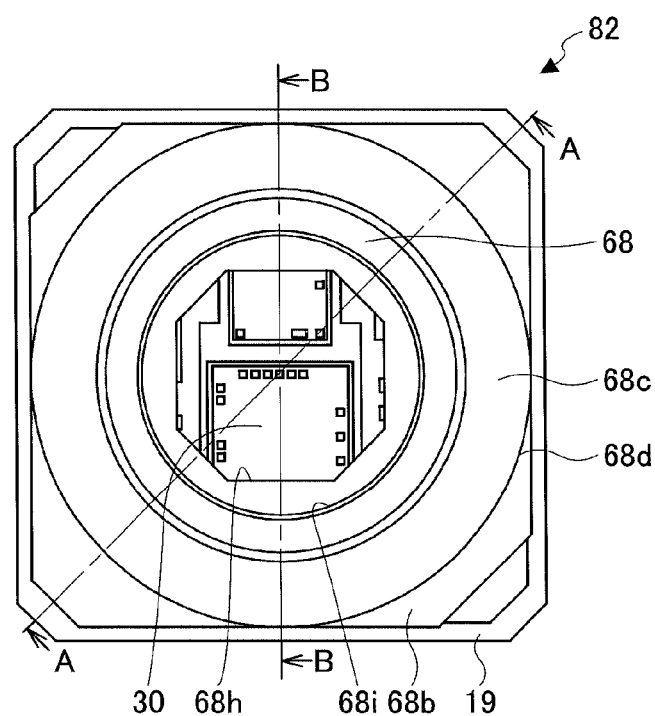
FIG. 19A, FIG. 19B, and FIG. 19C are diagrams illustrating one example of a semiconductor sensor device according to Practical Example 13 of the present invention.
Figure 19B:
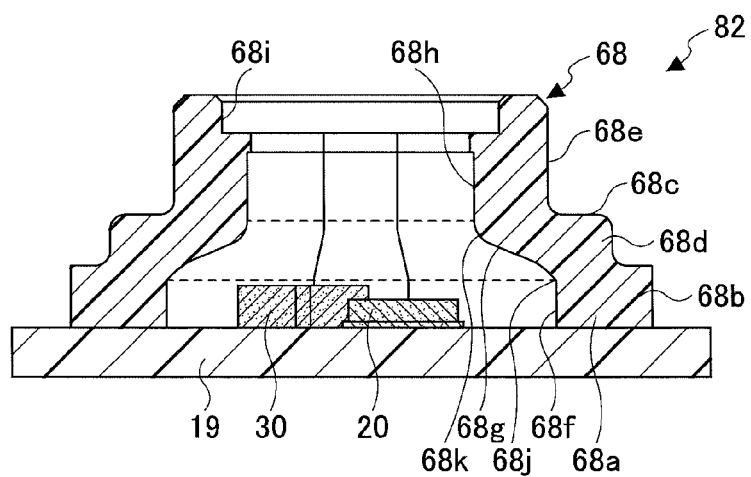
Figure 19C:
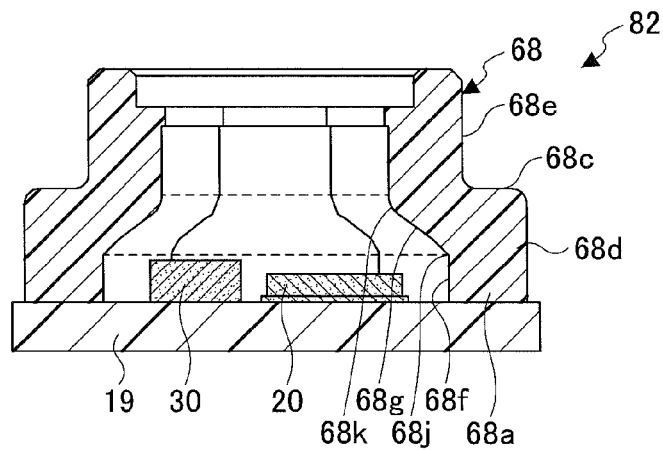

FIG. 19A, FIG. 19B, and FIG. 19C are diagrams illustrating one example of a semiconductor sensor device according to Practical Example 13 of the present invention. FIG. 19A is a top view of the one example of a semiconductor sensor device according to Practical Example 13 and FIG. 19B is an A-A cross-sectional diagram of the one example of a semiconductor sensor device according to Practical Example 13 as illustrated in FIG. 19A. Furthermore, FIG. 19C is a B-B cross-sectional diagram of the one example of a semiconductor sensor device according to Practical Example 13 as illustrated in FIG. 19A.

As illustrated in FIG. 19A-FIG. 19C, a semiconductor sensor device 82 according to Practical Example 13 has a control IC 20 and a sensor element 30 mounted on a substrate 19. Furthermore, a cylinder 68 is provided on the substrate 19 so as to surround a periphery of the control IC 20 and sensor element 30. Both the control IC 20 and the sensor element 30 are mounted on the substrate 19 in parallel but may be laminated and mounted thereon.

In FIG. 19B, the cylinder 68 has a bottom portion 68a, a base portion 68b, an overhanging portion 68d, a stepwise face 68c, and a circularly cylindrical portion 68e. The circularly cylindrical portion 68e has a smallest outer diameter and the overhanging portion 68d composes a circularly cylindrical portion with an outer diameter greater than that of the circularly cylindrical portion 68e, wherein it has a shape in which the circularly cylindrical portion 68e is laminated on a circularly cylindrical portion formed by the overhanging portion 68d. Then, the stepwise face 68c is formed by a difference between outer diameters thereof. Furthermore, the base portion 68b having a further greater diameter and having a generally quadrangular and planar shape approximating that of the substrate 19 is provided under the overhanging portion 68d. That is, the base portion 68b overhangs outward further than the overhanging portion 68d and a step is also formed between the overhanging portion 68d and the base portion 68b, so that double stepwise faces are formed as a whole. Additionally, the overhanging portion 68d has a circularly cylindrical outline similarly to the circularly cylindrical portion 68e, and hence, the circularly cylindrical portion 68e and the overhanging portion 68d may be referred to as a first circularly cylindrical portion 68e and a second circularly cylindrical portion 68d, respectively.

On the other hand, in FIG. 19C, only the overhanging portion 68d overhangs outward to provide one overhanging face. This is because outer ends of the overhanging portion 68d and the base portion 68b are coincident in a B-B cross section as illustrated in FIG. 19A.

Additionally, in the previous Practical Examples, even when double overhanging portions are provided, each has been referred to as an overhanging portion in a case where outlines of them are identical and are able to be regarded as one as a whole. However, in Practical Example 13, outlines of the overhanging portion 68d and the base portion 68b are different, and hence, both will be referred to distinctively.

As illustrated in FIG. 19A-FIG. 19C, an outline of the cylinder 68 has a shape in such a manner that the circularly cylindrical overhanging portion 68d is laminated on the base portion 68b formed into a generally quadrangular shape (accurately, an octagonal shape) along an outline of the substrate 19 and further the circularly cylindrical portion 68e with a smaller outer diameter is laminated on the overhanging portion 68d.

As illustrated in FIG. 19B and FIG. 19C, an inner peripheral face of the cylinder 68 is composed of an inner peripheral face 68f of the base portion 68b, an inner peripheral face 68g of the overhanging portion 68d, a lower inner peripheral face 68h of the circularly cylindrical portion 68e, and a top inner peripheral face 68i of the circularly cylindrical portion 68e.

As illustrated in FIG. 19A and FIG. 19B, an inner peripheral face of the circularly cylindrical portion 68e of the cylinder 68 is formed with an octagonal aperture while the top inner peripheral face 68i has a circular aperture and the lower inner peripheral face 68h has an octagonal column shape. Then, an octagonal shape continues to the inner peripheral face 68g of the overhanging portion 68d and the inner peripheral face 68f of the base portion 68b. Additionally, FIG. 19B and FIG. 19C are an A-A cross-sectional diagram and a B-B cross-sectional diagram of FIG. 19A, respectively, wherein a corner portion of an octagon of an inner peripheral face is indicated by a solid line. That is, each of FIG. 19B and FIG. 19C illustrates three octagonal faces.

Additionally, as illustrated in FIG. 19A, an octagon formed by the inner peripheral face 68h of the circularly cylindrical portion 68e is not a regular octagon but rather is a shape approximating a quadrangle as a whole. That is, respective sides of an octagon are not equal to have a shape approximating a quadrangle similar to a shape of the substrate 19, wherein only four corners thereof are cut off to form an octagon.

Thus, the semiconductor sensor device 82 according to Practical Example 13 is different from the semiconductor sensor device 80 or 81 according to any of Practical Examples 1 to 12 in that an inner peripheral face of the cylinder 68 is formed into a polygon.

Additionally, an inside of the cylinder 68 being filled with a sealing material 70 composed of a gel-like waterproof resin is similar to those of previous Practical Examples 1 to 12. Furthermore, the cylinder 68 that may be made of a plastic such as poly(phenylene sulfide) (PPP), a resin, etc., is also similar to those of previous Practical Examples 1 to 12, and hence, a description(s) thereof will be omitted.

Furthermore, a rounding process is applied to a connection portion 68*j* between the inner peripheral face 68*f* of the base portion 68*b* and the inner peripheral portion 68*g* of the overhanging portion 68*d* in an inner peripheral face of the cylinder 68 so as to provide a shape that does not generate a corner point. Thereby, it is possible to prevent contamination of an air bubble when an inside of the cylinder 68 is filled with the sealing material 70. That is, if a corner point is present in an inner peripheral portion of the cylinder 68 filled with the gel-like sealing material 70, the sealing material 70 does not sufficiently fill therein and contamination of an air bubble may be caused. In particular, if a corner approximating a right angle or a corner with an acute angle is present, retention of an air bubble may readily be caused. Hence, in the semiconductor sensor device 80 according to the present Practical Example, a rounding process is applied to the connection portion 68*j* between the mutually different inner peripheral portions 68*f* and 68*g* so that a corner point is eliminated or reduced, in order to prevent generation of such an air bubble. Similarly, a rounding process is also applied to a connection portion 68*k* between the inner peripheral face 68*g* of the overhanging portion 68*d* and the inner peripheral face 68*h* of the circularly cylindrical portion 68*e* so that a corner point of the connection portion 68*k* is eliminated or reduced, and thereby, generation of an air bubble at time of filling with the sealing material 70 is prevented.

Figure 20C:
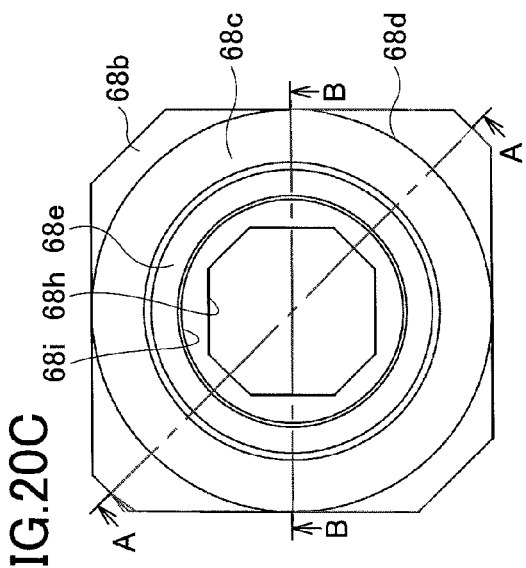
FIG. 20A, FIG. 20B, FIG. 20C, FIG. 20D, FIG. 20E, and FIG. 20F are diagrams illustrating one example of a cylinder of one example of a semiconductor sensor device according to Practical Example 13 of the present invention.
Figure 20B:
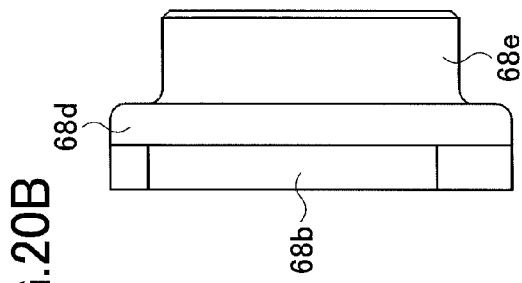
Figure 20A:
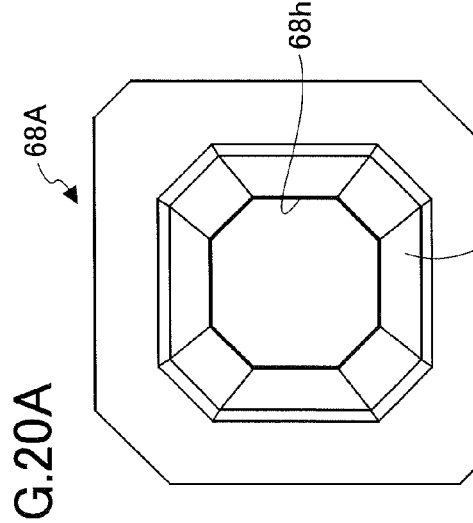
Figure 20F:
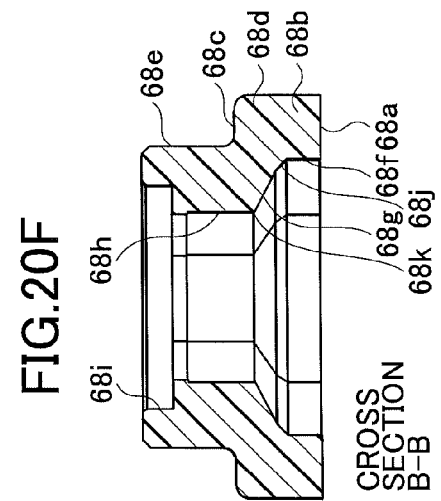
Figure 20E:
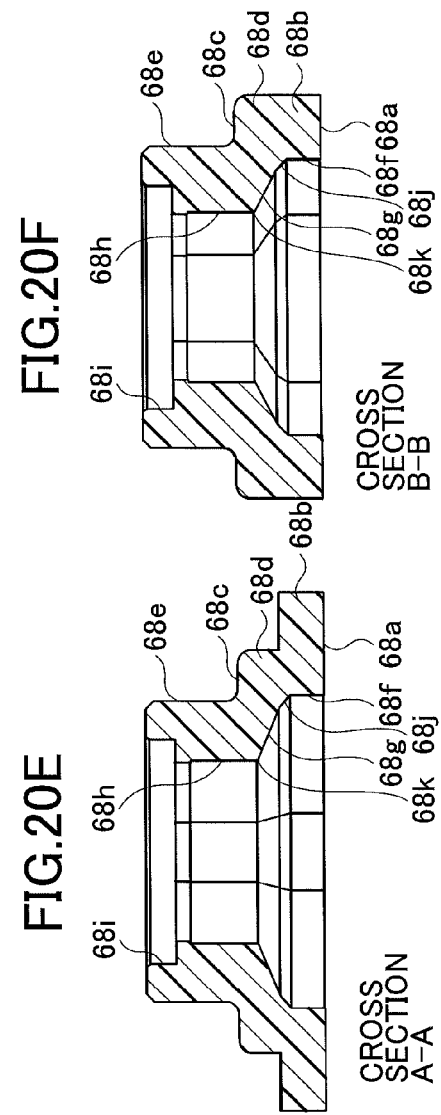
Figure 20D:
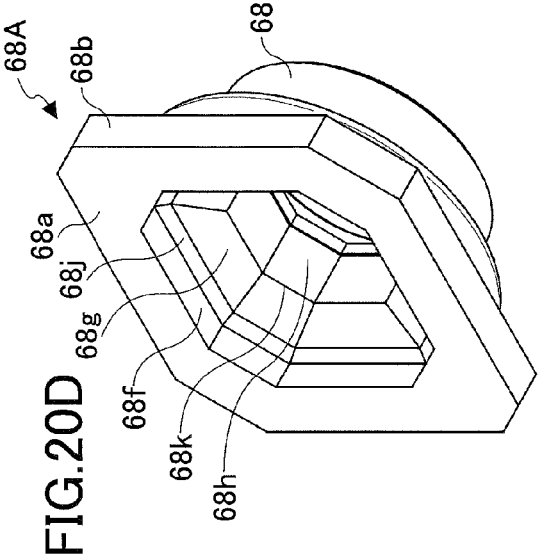

FIG. 20A, FIG. 20B, FIG. 20C, FIG. 20D, FIG. 20E, and FIG. 20F are diagrams illustrating one example of a cylinder 68A of one example of a semiconductor sensor device 82 according to Practical Example 13 of the present invention. FIG. 20A is a bottom view of the cylinder 68A of one example of the semiconductor sensor device 82 according to Practical Example 13 and FIG. 20B is a side view of the cylinder 68A of one example of the semiconductor sensor device 82 according to Practical Example 13. Furthermore, FIG. 20C is a top view of the cylinder 68A of one example of the semiconductor sensor device 82 according to Practical Example 13 and FIG. 20D is a perspective view of the cylinder 68A of one example of the semiconductor sensor device 82 according to Practical Example 13. Moreover, FIG. 20E is an A-A cross-sectional diagram of FIG. 20C and FIG. 20F is a B-B cross-sectional diagram of FIG. 20C.

FIG. 20A-FIG. 20F illustrate one example of a configuration of the cylinder 68A in the semiconductor sensor device 82 according to Practical Example 13 before a rounding process is applied thereto.

FIG. 20A and FIG. 20D illustrate a bottom view of the cylinder 68A and a perspective view of the cylinder 68A, respectively, wherein as illustrated in FIG. 20D, a space formed by the inner peripheral face 68*f* of the base portion 68*b* is a space approximating a rectangular parallelepiped, and accurately, a space with an octagonal planar shape having a height. That is, an octagon is provided by cutting off right angles of a rectangular shape and inserting one side between respective two sides providing a right angle so that the right angles are changed to obtuse angles.

Thus, it is preferable to form the inner peripheral face 68*f* of the base portion 68*b* of the cylinder 68A into a shape approximating a rectangular shape or a square shape. As illustrated in FIG. 19A, FIG. 19B, and FIG. 19C, the base portion 68*b* has a space for containing the control IC 20 and the sensor element 30. The control IC 20 and the sensor element 30 generally and frequently have rectangular shapes, and hence, it is frequently preferable for a shape of a bottom face of a space for containing them to be a shape approximating a rectangular shape. Hence, a space formed by the inner peripheral face 68*f* of the base portion 68*b* is a space approximating a generally rectangular parallelepiped in the cylinder 68A in the semiconductor sensor device 82 according to the present Practical Example.

On the other hand, the base portion 68*b* in the present Practical Example is not a complete rectangular shape but is an octagon provided by cutting off four corners of a rectangular shape. As illustrated in FIG. 19A, FIG. 19B, and FIG. 19C, this is because an air bubble is difficult to be generated at a smaller number of right angles or acute angles when an inside of the cylinder 68A is filled with the sealing material 70, and hence, a right angle is changed to an obtuse angle to suppress generation of air bubbles. Specifically, an octagon is provided by cutting off right angles of a rectangular shape and inserting one side between respective two sides providing a right angle, so that all of angles are 135 degrees and are changed to obtuse angles with respect to 90 degrees. Thus, a shape of a space formed by the inner peripheral face 68*f* of the base portion 68*b* is a polygonal column so that it is possible to eliminate a right angle at which an air bubble is readily generated.

Additionally, although FIG. 20D provides an example of a space formed by the inner peripheral face 68*f* of the base portion 68*b* being configured to be an octagonal column, a configuration of a polygonal column having a bottom shape with more corners than an octagon may be provided as long as a shape approximating a rectangular parallelepiped is such that there is not a difficulty in containing the control IC 20 and the sensor element 30. For example, four more sides may further be inserted between respective four sets of two corners to provide a dodecagon. In this case, it is possible for an angle of one corner to be 150 degrees, and hence, it is possible to change 90 degrees to a more obtuse angle and suppress generation of an air bubble.

However, when an air bubble is not particularly generated, the inner peripheral face 68*f* of the base portion 68*b* may be configured to be a rectangular parallelepiped with a quadrangular bottom face. The control IC 20 and the sensor element 30 are frequently configured to be rectangular parallelepiped shapes and a rectangular parallelepiped intrinsically provides a smaller amount of loss of space.

That is, it is possible for a space formed by the inner peripheral face 68*f* of the base portion 68*b* to be a variety of shapes as long as a shape approximating a rectangular parallelepiped is provided as a whole.

On the other hand, as illustrated in FIG. 20C, it is preferable for the lower inner peripheral face 68*h* of the circularly cylindrical portion 68*e* and the inner peripheral face 68*g* of the overhanging portion 68*d* to have an aperture shape that is an octagon or a polygon with more corners than it. Although an aperture shape of the top inner peripheral face 68*i* of the circularly cylindrical portion 68*e* is a circular shape as also illustrated in FIG. 19A, FIG. 19B, and FIG. 19C, this is because it is required to provide a top aperture with a circular shape in association with an electronic apparatus for incorporating the semiconductor sensor device 82. On the other hand, it is required that the inner peripheral face 68*f* of the base portion 68*b* forms a generally rectangular parallelepiped internal space for containing the control IC 20 and the sensor element 30 as described above. That is, it is required that a top portion and bottom portion of the cylinder 68 are circularly cylindrical and rectangular parallelepiped internal shapes, respectively. If these two different shapes are abruptly connected at any portion, an internal shape including a corner point may be provided due to a larger difference between the two shapes and generation of an air bubble may be caused at such a corner point. Furthermore, if a circularly cylindrical shape at a top portion and a rectangular parallelepiped shape at a bottom portion are connected by using only a curved face, a shape of an inner peripheral face of the cylinder 68 may be complicated and manufacturing thereof may be difficult.

Accordingly, in the present Practical Example, the lower inner peripheral face 68*h* of the circularly cylindrical portion 68*e* is an octagonal aperture shape approximating a circle rather than a quadrangular shape and the inner peripheral face 68*g* of the overhanging portion 68*d* is configured to be a connection face for connecting a top portion of the inner peripheral face 68*f* of the base portion 68*b* and a bottom portion of the inner peripheral face 68*h* of the circularly cylindrical portion 68*e*, as illustrated in FIG. 20A and FIG. 20C-FIG. 20F. Hence, the inner peripheral face 68*g* of the circularly cylindrical portion 68*d* has an aperture shape with a size decreasing from downward to upward, as if a portion of a side face of an octagonal pyramid is cut out. Thereby, it is possible to smoothly connect an internal space of the inner peripheral face 68*f* of the base portion 68*b*, which is an octagonal column approximating a rectangular parallelepiped, and an internal space of the inner peripheral face 68*h* of the circularly cylindrical portion 68*e*, which is an octagonal column approximating a circle.

Thus, the inner peripheral face 68*g* of the overhanging portion 68*d* functions as a connection face for connecting a bottom portion of the inner peripheral face 68*h* of the circularly cylindrical portion 68*e* and a top portion of the inner peripheral face 68*f* of the base portion 68*b*, so that it is possible to connect the top and bottom of an inner peripheral face of the cylinder 68 smoothly and it is possible to provide a shape difficult to generate an air bubble.

Furthermore, the inner peripheral face 68*g* of the overhanging portion 68*d* and the inner peripheral face 68*h* of the circularly cylindrical part 68*e* are configured to be polygonal shapes, so that a process for roughening the inner peripheral faces 68*g* and 68*h* is facilitated as compared to a case where these are composed of curved faces of a circular cylinder. As will be described in detail below, if surfaces of the inner peripheral faces 68*g* and 68*h* are too smooth in a case where the sealing material 70 that is a resin is applied to an inside of the cylinder 68, a wet resin may not spread out and application of a resin in a short period of time may be difficult.

Then, the inner peripheral face 68*g* of the overhanging portion 68*d* and the lower inner peripheral face 68*h* of the circularly cylindrical portion 68*e* are roughened by a process for surface texturing in the semiconductor sensor device 82 according to the present Practical Example. Thereby, wettability of the sealing material 70 is improved so that it is possible to conduct application of a resin in a short period of time.

Herein, a process for surface texturing with respect to the inner peripheral face 68*g* of the overhanging portion 68*d* and the lower inner peripheral face 68*h* of the circularly cylindrical portion 68*e* is conducted by contacting the inner peripheral faces 68*g* and 68*h* with electrodes and causing discharge therebetween, so that it is possible to conduct a roughening treatment more readily and sufficiently for a case of being a planar face than for a case of being a curved face such as a circularly peripheral face and it is possible to configure the cylinder 68 capable of applying a resin thereto in a short period of time.

Additionally, a roughening treatment is not limited to a roughening treatment based on discharge using electrodes but a variety of roughening treatments may be adopted, wherein it is frequently easier to conduct a process in a case where the inner peripheral faces 68*g* and 68*h* are planer faces than a case of being curved faces, even though any treatment is adopted.

Hence, in the semiconductor sensor device 82 according to the present Practical Example, the inner peripheral face 68*g* of the overhanging portion 68*d* and the lower inner peripheral face 68*h* of the circularly cylindrical portion 68*e* have aperture portions with polygonal shapes and surfaces thereof are roughened, so that it is possible to provide the cylinder 68 that is difficult to generate an air bubble and is capable of having a resin applied thereto in a short period of time.

Additionally, a top of the inner peripheral face 68*f* of the base portion 68*b* and a bottom of the inner peripheral face 68*g* of the overhanging portion 68*d* are connected, and hence, a polygonal shape formed by a bottom face of the base portion 68*b* and a polygonal shape formed by the inner peripheral face 68*g* of the overhanging portion 68*d* and the lower inner peripheral face 68*h* of the circularly cylindrical portion 68*e* are preferably polygonal shapes with identical corner numbers. That is because each face composing a polygonal shape of the inner peripheral face 68*f* of the base portion 68*b* and each face composing a polygonal shape of the inner peripheral face 68*g* of the overhanging portion 68*d* have one-to-one correspondence and configuration and processing thereof are easier.

However, it is not essential to provide polygonal shapes with identical corner numbers for a polygonal shape formed by the inner peripheral face 68*f* of the base portion 68*b* and a polygonal shape formed by the inner peripheral face 68*g* of the overhanging portion 68*d* and a variety of configurations may be provided according to an application. For example, it is possible to provide a configuration in such a manner that two faces are connected to one face, and hence, it is possible to provide a variety of combinations of a polygonal shape formed by the inner peripheral face 68*f* of the base portion 68*b* and a polygonal shape formed by the inner peripheral face 68*g* of the overhanging portion 68*d*.

Additionally, it is preferable to configure the inner peripheral face 68*f* of the base portion 68*b* as small as possible, configure the inner peripheral faces 68*h* and 68*i* of the circularly cylindrical portion 68*e* as large as possible, and configure a difference between sizes of the top and bottom thereof not to be large, from the viewpoint of improvement of a yield at time of manufacturing of the semiconductor sensor device 82. That is because a position of a top of a resin is difficult to be changed even if an amount of a filling resin is changed in a case where an inside of the cylinder 68 is filled with the sealing material 70.

However, the sensor element 30 to be contained in the base portion 68*b* has a surface with a resin repelling property and if arrangement is provided to be too close to the inner peripheral face 68*f*, an air bubble may be generated thereat, wherein it is preferable to provide arrangement so as to keep a certain amount of distance from the inner peripheral face 68*f*. Furthermore, the control IC 20 and the sensor element 30 are electrically connected by wire bonding, wherein if both are too close, a bonding wire for connecting them may be too short and strength thereof may be reduced. Hence, it may also be necessary to arrange the sensor element 30 and the control IC 20 separately to some extent in order to keep strength of a wire bonding. As these constraints are taken into consideration, the inner peripheral face 68*f* of the base portion 68*b* may have to be large to some extent, and this may cause generation of a corner point on the inner peripheral face 68*f* of the base portion 68*b* and be a factor for inducing generation of an air bubble. In the semiconductor sensor device 82 according to the present Practical Example, the inner peripheral face 68*g* of the overhanging portion 68*d* which has a polygonal connection face is provided so that a configuration for suppressing such generation of an air bubble is attained.

In FIG. 20E and FIG. 20F, a corner rounding treatment has not been applied to the connection portion 68j between the inner peripheral face 68f of the base portion 68b and the inner peripheral face 68g of the overhanging portion 68d and the connection portion 68k between the inner peripheral face 68g of the overhanging portion 68d and the inner peripheral face 68h of the circularly cylindrical portion 68e, and a condition that the respective inner peripheral faces 68f, 68g, and 68h are directly connected is illustrated. A structure of an inner peripheral face of the cylinder 68 in the semiconductor sensor device 82 according to the present Practical Example is clearly indicated by illustrating corners thereof and it is possible to understand that the respective inner peripheral faces 68f, 68g, and 68h include polygonal faces.

FIG. 21A, FIG. 21B, FIG. 21C, FIG. 21D, and FIG. 21E are diagrams illustrating a configuration of one example of the cylinder 68 in the semiconductor sensor device 82 according to Practical Example 13 of the present invention. FIG. 21A is a plan view illustrating the one example of the cylinder 68 of the semiconductor sensor device 82 according to Practical Example 13 of the present invention, FIG. 21B is an A-A cross-sectional diagram of FIG. 21A, and FIG. 21c is a B-B cross-sectional diagram of FIG. 21A. Furthermore, FIG. 21D is a top perspective view of the one example of the cylinder 68 of the semiconductor sensor 82 device according to Practical Example 13 of the present invention and FIG. 21E is bottom perspective view of the one example of the cylinder 68 of the semiconductor sensor device 82 according to Practical Example 13 of the present invention.

FIG. 21B and FIG. 21C illustrate cross-sectional views of the cylinder 68 in the semiconductor sensor device 82 according to Practical Example 13. A rounding process treatment for rounding a corner being conducted for the connection portion 68j between the inner peripheral face 68f of the base portion 68b and the inner peripheral face 68g of the overhanging portion 68d and the connection portion 68k between the inner peripheral face 68g of the overhanging portion 68d and the lower inner peripheral portion 68h of the circularly cylindrical portion 68e so as to eliminate a line of a corner is different from the cross-sectional views illustrated in FIG. 20E and FIG. 20F.

As illustrated in FIG. 21B and FIG. 21C, a process for rounding the connection portions 68j and 68k are conducted to provide a shape in such a manner that a line of inner peripheral faces that continues among the inner peripheral face 68h of the circularly cylindrical portion 68e, the inner peripheral face 68g of the overhanging portion 68d, and the inner peripheral face 68f of the base portion 68b smoothly draw a figure S. Thus, the inner peripheral faces 68h, 68g, and 68f are connected by a smooth curved face with a corner eliminated, so that it is possible to prevent generation of an air bubble when an inside of the cylinder 68 is filled with the sealing material 70.

Furthermore, a bottom face of the cylinder 68 has a shape approximating a quadrangular shape as illustrated in FIG. 21D and a top face of the cylinder 68 has a circular aperture as illustrated in FIG. 21E. Then, an inside of the cylinder 68 is connected to an octagonal column and a pyramidal aperture sequentially to configure the inner peripheral faces 68f, 68g, and 68i of the cylinder 68. Due to such a configuration, it is possible to comply with configuration requests that are containment of a rectangular parallelepiped component such as the control IC 20 or the sensor element 30 and a top aperture with a circularly cylindrical shape and comply with quality requests such as filling with the sealing material 70 without contamination of an air bubble and improvement of a light blocking property.

Figure 22:
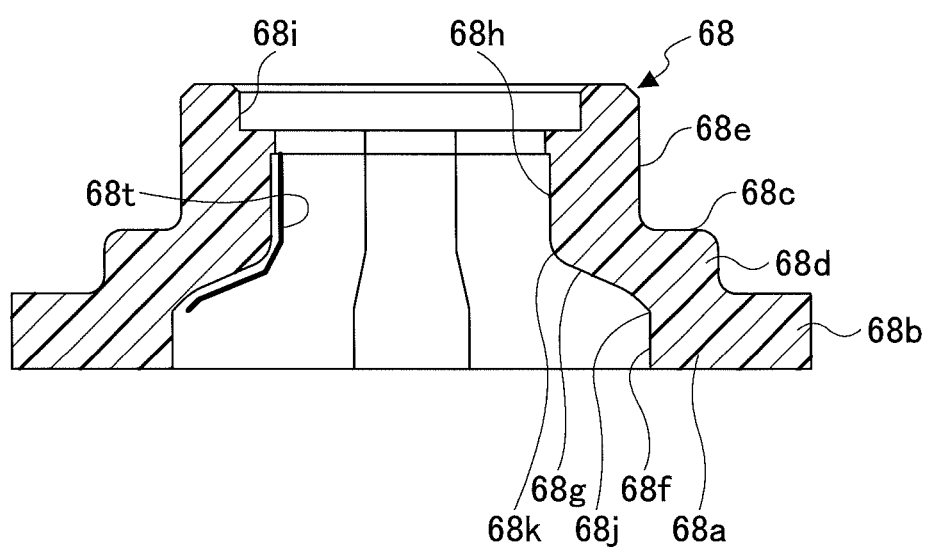
FIG. 22 is a diagram illustrating a range of a roughening process of one example of a cylinder of a semiconductor sensor device according to Practical Example 13 of the present invention.

FIG. 22 is a diagram illustrating a range of a roughening process of one example of the cylinder 68 of the semiconductor sensor device 82 according to Practical Example 13 of the present invention.

FIG. 22 illustrates a cross-sectional configuration of the cylinder 68, wherein a roughening process range 68t is illustrated over the inner peripheral face 68g of the overhanging portion 68d and the lower inner peripheral face 68h of the circularly cylindrical portion 68e. As described above, a process for surface texturing is applied to an inner peripheral face of the cylinder 68, so that wettability of a resin to be used as the sealing material 70 is improved to spread the sealing material 70 to a corner of an inner peripheral face and it is difficult to generate an air bubble, whereby it is possible to apply a resin to an inside of the cylinder 68 in a short period of time.

As illustrated in FIG. 22, in the present Practical Example, the roughening process range 68t is limited to the inner peripheral face 68g of the overhanging portion 68d and the lower inner peripheral face 68h of the circularly cylindrical portion 68e and is not formed on the inner peripheral face 68f of the base portion 68b. This is because the sensor element 30 is contained in the inner peripheral face 68f of the base portion 68b and connected to an exterior by a wiring, and hence, dimensional accuracy is emphasized in order to prevent an irregularity from being generated in a distance between the sensor element 30 and the inner peripheral face 68f of the base portion 68b or an irregularity from being generated in capacity. Furthermore, that is because it takes into consideration that when the cylinder 68 is processed by using a die, the base portion 68b is a portion contacting a male die and a burr may be generated thereon.

Additionally, a roughening treatment may be, for example, a process for damaging a surface due to discharge using electrodes or may be another process.

Furthermore, it is possible for a surface roughness in roughening to be in a variety of ranges according to an application, and for example, a ten-point average roughness Rz may be in a range of 10-30 μm, and preferably, may be in a range of 15-25 μm. More preferably, a surface roughness Rz may be set at near 20 μm.

Thus, a roughening process in a predetermined range is conducted for an inner peripheral face of the cylinder 68 so that it is possible to improve wettabilities of the inner peripheral faces 68g and 68h of the cylinder 68 and attain reduction of a fabrication time.

Additionally, the semiconductor sensor device 82 according to Practical Example 13 that may be contained in the housing 94 by using the O-ring 102 to configure an electronic apparatus as illustrated in FIG. 18A, FIG. 18B, FIG. 18C, FIG. 18D, FIG. 18E, and FIG. 18F is similar to that of Practical Example 12, and hence, a description(s) for this matter will be omitted.

Furthermore, although examples of a space formed by the inner peripheral face 68f of the base portion 68b being an octagonal column, a space formed by the inner peripheral face 68g of the overhanging portion 68d being a part of an octagonal pyramid, and a space formed by the inner peripheral face 68h of the circularly cylindrical portion 68e being an octagonal column have been provided and described in Practical Example 13, it is possible to have combinations of a variety of corner numbers.

Although preferred practical examples of the present invention have been described above in detail, the present invention is not limited to the practical examples described above and it is possible to apply a variety of modifications and substitutions to the practical examples described above without departing from the scope of the present invention.

APPENDIX

An Illustrative Embodiment(s) of a Semiconductor Sensor Device and an Electronic Apparatus Using the Same At least one illustrative embodiment of the present invention may relate to at least one of a semiconductor sensor device and an electronic apparatus using the same.

An object of at least one illustrative embodiment of the present invention may be to provide a semiconductor sensor device capable of attaining miniaturization and a higher strength thereof and an electronic apparatus using the same.

At least one illustrative embodiment of the present invention may be a semiconductor sensor device (80) including a hollow member (60) that surrounds a periphery of a sensor element (30), a sealing material (70) that fills in the hollow member (60) and covers the sensor element (30), and a substrate (10) on which the sensor element (30) is mounted, wherein a recess (11) that positions the hollow member (60) is formed on the substrate (10).

At least one illustrative embodiment of the present invention may be a semiconductor sensor device (81, 82) having a sensor element (30), a substrate (10, 16-19) on which the sensor element (30) is mounted, a hollow member (64-68) mounted on the substrate (10, 16-19) and covering a periphery of the sensor element (30), and a sealing material (70) filling in the hollow member (64-68) and covering the sensor element (30), wherein a stepwise face (64c-68c) with a height less than that of an inside of the hollow member (64-68) is formed on an outside thereof in a direction of a thickness thereof.

Illustrative Embodiment (1) is a semiconductor sensor device including a hollow member that surrounds a periphery of a sensor element, a sealing material that fills in the hollow member and covers the sensor element, and a substrate on which the sensor element is mounted, wherein a recess that positions the hollow member is formed on the substrate.

Illustrative Embodiment (2) is the semiconductor sensor device as described in Illustrative Embodiment (1), wherein the sensor element is mounted in the recess.

Illustrative Embodiment (3) is the semiconductor sensor device as described in Illustrative Embodiment (1) or (2), including a control IC that is laminated with the sensor element and mounted in the recess.

Illustrative Embodiment (4) is the semiconductor sensor device as described in any one of Illustrative Embodiments (1) to (3), wherein the recess has an outline that surrounds a perimeter of a bottom part of the hollow member and includes a portion with a length identical to a length of the bottom part of the hollow member.

Illustrative Embodiment (5) is the semiconductor sensor device as described in any one of Illustrative Embodiments (1) to (4), wherein a stepwise face with a height less than that of the hollow member at an inside thereof in a direction of a thickness thereof is formed at an outside thereof.

Illustrative Embodiment (6) is an electronic apparatus including the semiconductor sensor device as described in any one of Illustrative Embodiments (1) to (5), and a housing that has a concave semiconductor sensor device containment part that contains the semiconductor sensor device.

Illustrative Embodiment (7) is the electronic apparatus as described in Illustrative Embodiment (6), wherein an elastic member is provided between a bottom face of the semiconductor sensor device containment part and the semiconductor sensor device.

Illustrative Embodiment (8) is an electronic apparatus including the semiconductor sensor device as described in Illustrative Embodiment (5), a housing that has a concave semiconductor sensor device containment part that contains the semiconductor sensor device, and an elastic member provided in a space formed by a bottom face of the semiconductor device containment part and the stepwise face of the semiconductor device.

Illustrative embodiment (9) is a semiconductor sensor device, comprising a sensor element, a substrate on which the sensor element is mounted, a hollow member mounted on the substrate and covering a periphery of the sensor element, and a sealing material filling in the hollow member and covering the sensor element, wherein a stepwise face with a height less than that of an inside of the hollow member is formed on an outside thereof in a direction of a thickness thereof.

Illustrative embodiment (10) is the semiconductor sensor device as described in illustrative embodiment (9), wherein the hollow member forms the stepwise face due to a shape of an outline provided by stacking a first circularly cylindrical part having a first outer diameter on a second circularly cylindrical part having a second outer diameter greater than the first outer diameter.

Illustrative embodiment (11) is the semiconductor sensor device as described in illustrative embodiment (10), wherein the substrate has a generally quadrangular shape and the hollow member further has a base part having an outline generally along an outline of the substrate.

Illustrative embodiment (12) is the semiconductor sensor device as described in illustrative embodiment (11), wherein an internal space formed by an inner peripheral face of the base part includes a space with a shape approximating a rectangular parallelepiped and an internal space formed by an inner peripheral face of the first circularly cylindrical part includes a circularly cylindrical space, at least, at a top portion thereof.

Illustrative embodiment (13) is the semiconductor sensor device as described in illustrative embodiment (12), wherein an inner peripheral face of the second circularly cylindrical part is a connection face connecting the inner peripheral face of the base part and the inner peripheral face of the first circularly cylindrical part.

Illustrative embodiment (14) is the semiconductor sensor device as described in illustrative embodiment (13), wherein the internal space formed by the inner peripheral face of the first circularly cylindrical part forms a space of a polygonal column under the circularly cylindrical space and the connection face has a connection face corresponding to each of faces of the polygonal column.

Illustrative embodiment (15) is the semiconductor sensor device as described in illustrative embodiment (14), wherein the polygonal column is a polygonal column having a corner greater than or equal to that of an octagonal column.

Illustrative embodiment (16) is the semiconductor sensor device as described in illustrative embodiment (15), wherein a space with a shape approximating the rectangular parallelepiped is a space formed in such a manner that a polygon formed by cutting between four rectangular corners and inserting a single or plural sides between two sides providing the rectangular corners has a height.

Illustrative embodiment (17) is the semiconductor sensor as described in illustrative embodiment (16), wherein numbers of corners of the polygonal column and the polygon are identical numbers.

Illustrative embodiment (18) is the semiconductor sensor device as described in illustrative embodiment (17), wherein the polygonal column is an octagonal column and the polygon is an octagon.

Illustrative embodiment (19) is the semiconductor sensor device as described in any one of illustrative embodiments (13) to (18), wherein the connection face is rounded not to generate a corner point at a position of connection to the inner peripheral face of the base part and a position of connection to the first circularly cylindrical part.

Illustrative embodiment (20) is the semiconductor sensor device as described in illustrative embodiment (19), wherein an inner peripheral face of the first circularly cylindrical part, the inner peripheral face of the second circularly cylindrical part, and an inner peripheral face of the base part are provided in such a manner that the inner peripheral face of the first circularly cylindrical part and the inner peripheral face of the base part generally along outlines of the first circularly cylindrical part and the base part are connected to provide the connection face with a generally S-shape, so that a thickness of the hollow member is generally constant at the first circularly cylindrical part, the second circularly cylindrical part, and the base part.

Illustrative embodiment (21) is the semiconductor sensor device as described in any one of illustrative embodiments (13) to (20), wherein the connection face and the inner peripheral face of the first circularly cylindrical part which forms a space of the polygonal column are roughened.

Illustrative embodiment (22) is an electronic apparatus comprising the semiconductor sensor device as described in any one of illustrative embodiments (9) to (21), a housing having a concave semiconductor sensor device containment part for containing the semiconductor sensor device, and an elastic member provided in a space formed by a bottom face of the semiconductor sensor device containment part and the stepwise face of the semiconductor sensor device.

According to at least one illustrative embodiment of the present invention, it may be possible to attain miniaturization and a higher strength of a semiconductor sensor device.

Although the illustrative embodiments and specific examples of the present invention have been described with reference to the accompanying drawings, the present invention is not limited to any of the illustrative embodiments and specific examples, and the illustrative embodiments and specific examples may be altered, modified, or combined without departing from the scope of the present invention.

The present application claims the benefit of priority based on Japanese Patent Application No. 2012-053809 filed on Mar. 9, 2012, Japanese Patent Application No. 2012-218031 filed on Sep. 28, 2012, and Japanese Patent Application No. 2013-042610 filed on Mar. 5, 2013, the entire contents of which are hereby incorporated by reference herein.

What is claimed is:

1. A semiconductor sensor device, comprising:
   a substrate;
   a sensor element mounted on the substrate, the sensor element including a diaphragm;
   a cylindrical member configured to surround a periphery of the sensor element, the cylindrical member being provided to press an elastic member against a semiconductor sensor device containment part configured to contain the semiconductor sensor device;
   a gel-like sealing material configured to fill in the cylindrical member and cover the sensor element; and
   a recess formed on the substrate, the recess being configured to position the cylindrical member.

2. The semiconductor sensor device as claimed in claim 1, wherein the sensor element is mounted in the recess.

3. The semiconductor sensor device as claimed in claim 1, further comprising a control integrated circuit laminated with the sensor element and mounted in the recess.

4. The semiconductor sensor device as claimed in claim 1, wherein an outline of the recess is configured to surround a perimeter of a bottom part of the cylindrical member and the recess includes a portion with a length identical to a length of the bottom part of the cylindrical member.

5. The semiconductor sensor device as claimed in claim 1, wherein the cylindrical member includes a stepwise face formed at an outside of the cylindrical member and a height of the stepwise face is less than a height of the cylindrical member at an inside of the cylindrical member.

6. An electronic apparatus, comprising:
   the semiconductor sensor device as claimed in claim 5;
   a housing, the housing including a concave semiconductor sensor device containment part configured to contain the semiconductor sensor device; and
   an elastic member provided in a space formed by a bottom face of the semiconductor sensor device containment part and the stepwise face included in the cylindrical member.

7. An electronic apparatus, comprising:
   the semiconductor sensor device as claimed in claim 1; and
   a housing, the housing including a concave semiconductor sensor device containment part configured to contain the semiconductor sensor device.

8. The electronic apparatus as claimed in claim 7, further comprising an elastic member provided between a bottom face of the semiconductor sensor device containment part and the semiconductor sensor device.

9. A semiconductor sensor device, comprising:
   a substrate;
   a sensor element mounted on the substrate, the sensor element including a diaphragm;
   a cylindrical member mounted on the substrate, the cylindrical member being configured to cover a periphery of the sensor element, the cylindrical member including a stepwise face formed at an outside of the cylindrical member, the stepwise face having a height less than a height of the cylindrical member at an inside of the cylindrical member, the stepwise face being provided to press an elastic member against a semiconductor sensor device containment part configured to contain the semiconductor sensor device; and
   a gel-like sealing material configured to fill in the cylindrical member and cover the sensor element.

10. The semiconductor sensor device as claimed in claim 9, wherein the cylindrical member is configured to include a first circularly cylindrical portion with a first outer diameter and a second circularly cylindrical portion with a second outer diameter greater than the first diameter, to provide the stepwise face.

11. The semiconductor sensor device as claimed in claim 10, wherein the cylindrical member further includes a base portion provided at a side of the substrate.

12. The semiconductor sensor device as claimed in claim 11, wherein an inner peripheral face of the second circularly cylindrical portion includes a connection portion configured to connect an inner peripheral face of the first circularly cylindrical portion and an inner peripheral face of the base portion.

13. The semiconductor sensor device as claimed in claim 12, wherein the connection portion is rounded.

14. The semiconductor sensor device as claimed in claim 10, wherein at least a portion of an inner peripheral face of the first circularly cylindrical portion and at least a portion of an inner peripheral face of the second circularly cylindrical portion are roughened.

15. An electronic apparatus, comprising:
the semiconductor sensor device as claimed in claim 9;
a housing, the housing including a concave semiconductor sensor device containment part configured to contain the semiconductor sensor device; and
an elastic member provided in a space formed by a bottom face of the semiconductor sensor device containment part and the stepwise face included in the cylindrical member.

16. A semiconductor sensor device, comprising:
a substrate;
a sensor element mounted on the substrate, the sensor element including a diaphragm;
a cylindrical member mounted on the substrate, the cylindrical member being configured to cover a periphery of the sensor element, the cylindrical member including a stepwise face formed at an outside of the cylindrical member, the stepwise face having a height less than a height of the cylindrical member at an inside of the cylindrical member; and
a gel-like sealing material configured to fill in the cylindrical member and cover the sensor element,
wherein the cylindrical member is configured to include a first circularly cylindrical portion with a first outer diameter and a second circularly cylindrical portion with a second outer diameter greater than the first diameter, to provide the stepwise face,
wherein the cylindrical member further includes a base portion provided at a side of the substrate, and
wherein an inner peripheral face of the second circularly cylindrical portion includes a connection portion configured to connect an inner peripheral face of the first circularly cylindrical portion and an inner peripheral face of the base portion.

* * * * *